US008649988B2

(12) United States Patent
Murochi et al.

(10) Patent No.: US 8,649,988 B2
(45) Date of Patent: Feb. 11, 2014

(54) SERVICE LIFE ESTIMATION METHOD FOR LEAD STORAGE BATTERY AND POWER SOURCE SYSTEM

(75) Inventors: Harumi Murochi, Aichi (JP); Yasuyuki Yoshihara, Aichi (JP)

(73) Assignee: Panasonic Corporation, Osaka (JP)

( * ) Notice: Subject to any disclaimer, the term of this patent is extended or adjusted under 35 U.S.C. 154(b) by 867 days.

(21) Appl. No.: 12/865,097

(22) PCT Filed: Jul. 1, 2009

(86) PCT No.: PCT/JP2009/003054

§ 371 (c)(1), (2), (4) Date: Jul. 28, 2010

(87) PCT Pub. No.: WO2010/001605

PCT Pub. Date: Jan. 7, 2010

(65) Prior Publication Data

US 2011/0004428 A1 Jan. 6, 2011

(30) Foreign Application Priority Data

Jul. 2, 2008 (JP) ................................ 2008-172985

(51) Int. Cl.
*G01R 31/36* (2006.01)

(52) U.S. Cl.
USPC ........................................................ 702/63

(58) Field of Classification Search
USPC ........................................................ 702/63
See application file for complete search history.

(56) References Cited

U.S. PATENT DOCUMENTS

| | | | |
|---|---|---|---|
| 6,433,513 | B1 | 8/2002 | Hayashi |
| 6,836,122 | B2 | 12/2004 | Tojima |
| 6,850,036 | B2 | 2/2005 | Lin et al. |
| 2003/0231006 | A1 | 12/2003 | Tojima |
| 2007/0145949 | A1 | 6/2007 | Matsushima et al. |

FOREIGN PATENT DOCUMENTS

| | | | |
|---|---|---|---|
| CN | 1288270 | A | 3/2001 |
| CN | 101141070 | A | 3/2008 |
| JP | 5-172912 | | 7/1992 |
| JP | 5-315015 | | 11/1993 |
| JP | 2002-340997 | | 11/2002 |
| JP | 2004-022183 | | 1/2004 |

*Primary Examiner* — Stephen Cherry

(74) *Attorney, Agent, or Firm* — McDermott Will & Emery LLP

(57) ABSTRACT

An estimation unit that estimates an estimated remaining service life of the lead storage battery implements: a storage step of storing an integral discharge threshold A that is a reference for determination of a service life of the lead storage battery under a standard condition with predetermined values of a surface temperature, a charge current, and a discharge current of the lead storage battery; a calculation step of calculating an integral discharged capacity B that represents an accumulated value of a discharged capacity of the lead storage battery under the actual conditions such as giving deterioration that same order as that occurring when the lead storage battery is repeatedly discharged under the standard conditions; a subtraction step of obtaining a differential electric quantity A–B by subtracting the integral discharged capacity B from the integral discharge threshold A; and an estimation step of estimating the estimated remaining service life of the lead storage battery by using the differential electric quantity.

28 Claims, 19 Drawing Sheets

TEMPERATURE - COEFFICIENT CORRELATION DIAGRAM

FIG.6

CHARGE CURRENT - TEMPERATURE DIFFERENCE CORRELATION DIAGRAM

| CHARGE CURRENT VALUE (HOUR RATE) | TEMPERATURE RISE AT CHARGE END (°C) | DIFFERENCE WITH TEMPERATURE RISE AT CHARGE END IN CASE OF 10 HOUR RATE CHARGE (°C) |
|---|---|---|
| 1 | 25 | 15 |
| 5 | 15 | 5 |
| 10 | 10 | 0 |
| 20 | 5 | −5 |
| 40 | 3 | −7 |

ACCEPTANCE OF LEAD STORAGE BATTERY

"Cc−C80"−"COEFFICIENT" CORRELATION DIAGRAM

FIG.15

| SURFACE TEMPERATURE \ OVERCHARGE DIFFERENCE $C_c - C_{80}$ | 2 | 2.38 | 2.5 |
|---|---|---|---|
| 0 | 0.7 | 0.914 | 0.93 |
| 10 | 0.5 | 0.92 | 1.05 |
| 20 | 0.3 | 0.95 | 1.1 |
| 25 | 0.31 | 1 | 1.68 |
| 40 | 0.4 | 1.42 | 1.72 |
| 45 | 0.52 | 1.6 | 1.95 |

TOTAL COEFFICIENT X

TOTAL COEFFICIENT X

SERVICE LIFE ESTIMATION METHOD FOR LEAD STORAGE BATTERY AND POWER SOURCE SYSTEM

RELATED APPLICATIONS

This application is the U.S. National Phase under 35 U.S.C. §371 of International Application No. PCT/JP2009/003054, filed on Jul. 1, 2009, which in turn claims the benefit of Japanese Application No. 2008-172985, filed on Jul. 2, 2008, the disclosures of which Applications are incorporated by reference herein.

TECHNICAL FIELD

The present invention relates to a service life estimation method for a lead storage battery and a power source system using the lead storage battery.

BACKGROUND ART

As the trend to inhibiting the release of carbon dioxide and depletion of oil resources has been rising, much is expected of the development of small vehicles using only electric power (for example, secondary batteries such as lead storage batteries) as drive power.

Among such power sources, lead storage batteries, which excel in toughness and have a suitable weight, can be considered useful as power sources, for example, in transport vehicles.

Various methods for accurately estimating the usage limit of lead storage batteries and rationally replacing the batteries have been studied. For example, Patent Document 1 describes a method by which a surface temperature of a lead storage battery using a trickle or a float (a lead storage battery that is trickle charged or float charged) is continuously measured and a capacity deterioration rate of the lead storage battery is calculated with consideration for the surface temperature. Patent Document 1 also describes an uninterruptible power source device that constantly supplies a very small charging current to the lead storage battery, wherein the capacity deterioration rate can be calculated with good accuracy with consideration for the dependence on the lead storage battery temperature. By using this method it is possible to estimate with good accuracy the usage limit of lead storage batteries that are used for various applications, and the effect obtained seems to be high.

The uninterruptible power source device described in Patent Document 1 is provided for use in case of power outage that occurs on an irregular base and normally is not discharged. However, the aforementioned transport vehicles normally consume power (travel). Moreover, in the transport vehicles, a rather remarkable SOC (State of Charge) of lead storage batteries is changed due to repeated travel (discharging) and charging. In such applications, the service life of the lead storage battery cannot be accurately estimated by simply measuring the surface temperature of the lead storage battery. Further, taking into account that the travel distance (SOC change) of a transport vehicle is not constant, and the input capacity (input electric quantity) per one cycle also varies, it appears to be difficult to estimate the service life of a lead storage battery by the number of charging cycles (number of cycles).

Patent Document 1: Japanese Patent Application Laid-Open No. 05-315015.

DISCLOSURE OF THE INVENTION

The present invention has been created to resolve the aforementioned problems and it is an object of the invention to provide a method suitable for accurately estimating the usage limit of a lead storage battery and accurately evaluating the rational replacement period of the lead storage battery in a case where the lead storage battery is used in a cyclic mode such as that of a power source for a transport vehicle and also to provide a power source system that can realize such a method.

A service life estimation method for a lead storage battery according to one aspect of the present invention includes the following steps implemented by an estimation unit that estimates an estimated remaining service life of the lead storage battery: a storage step of storing an integral discharge threshold A that is a reference for determination of a service life of the lead storage battery under a standard condition with predetermined values of a surface temperature, a charge current, and a discharge current of the lead storage battery; a calculation step of calculating an integral discharged capacity B by replacing the accumulated value of discharged capacity when the lead storage battery deteriorates to a level under the actual conditions including the actually measured values of the surface temperature, the charge current, and the discharge current of the lead storage battery with an accumulated value of discharged capacity when the lead storage battery would deteriorate under said standard condition to substantially the same level as said deterioration level under the actual condition, and a subtraction step of obtaining a differential electric quantity A−B by subtracting the integral discharged capacity B from the integral discharge threshold A; and an estimation step of estimating the estimated remaining service life of the lead storage battery by using the differential electric quantity A−B.

With such a configuration, the remaining service life of the lead storage battery is estimated from a value obtained by subtracting the integral discharged capacity B (accumulated value of volume changes in the lead dioxide) that is calculated by replacing the accumulated value of discharged capacity when the lead storage battery deteriorates to a level under the actual conditions including the actually measured values of the surface temperature, the charge current, and the discharge current of the lead storage battery with an accumulated value of discharged capacity when the lead storage battery would deteriorate under said standard condition to substantially the same level as said deterioration level under the actual condition from the integral discharge threshold A for serving to demand that the use of the lead storage battery be stopped.

Therefore, by determining a difference between the integral discharge threshold A that demands that the use of the lead storage battery be stopped and the integral discharged capacity B that represents the accumulated value of volume changes in the lead dioxide, it is possible to determine the degree to which the accumulated value of the volume changes in the lead dioxide came close to the integral discharge threshold A that demands that the use of the lead storage battery be stopped. As a result, the estimation accuracy of the remaining service life of the lead storage battery is increased and therefore the remaining service life of the lead storage battery can be estimated with good accuracy. Therefore, for example, the usage limit of the lead storage battery can be accurately evaluated and the rational replacement period of the lead storage battery can be accurately estimated in a case where the lead storage battery is used in a cyclic mode such as that of a power source for a transport vehicle. Further, a distance that can be traveled by the transport vehicle can be easily estimated.

BRIEF DESCRIPTION OF THE DRAWINGS

FIG. 6 illustrates an example of correlation between a charge current and a difference in temperature of a lead storage battery;

FIG. 15 illustrates an example of a total coefficient based on the overcharge electric quantity (difference $C_c$–$C_{80}$) and a surface temperature of a lead storage battery;

BEST MODE FOR CARRYING OUT THE INVENTION

Figure 1:
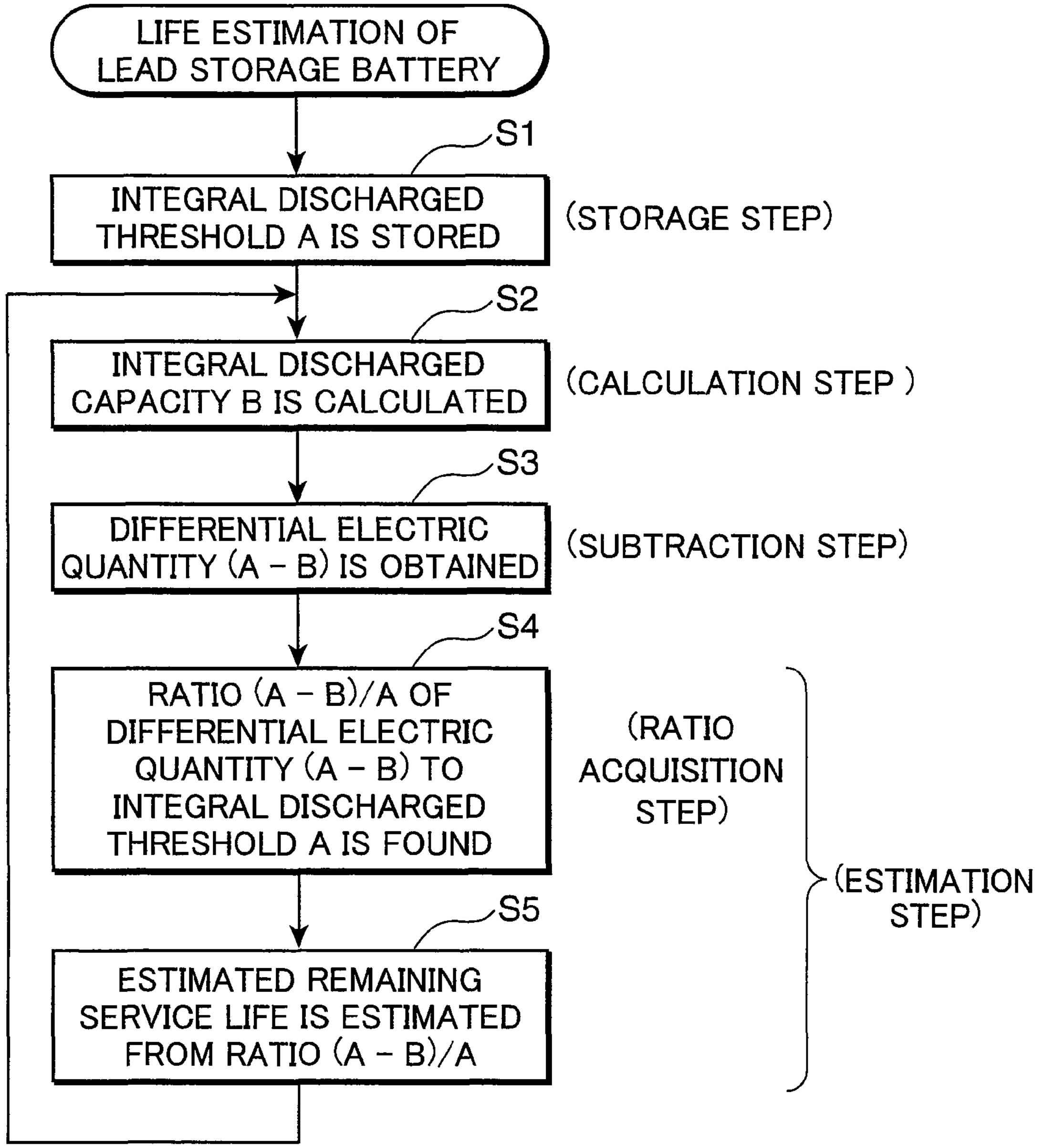
FIG. 1 is a flowchart illustrating an example of service life estimation processing performed by a power source system.

The modes for carrying out the invention will be explained below with reference to the appended drawings.

The first embodiment relates to a service life estimation method for a lead storage battery. A specific feature of this embodiment is that a remaining service life of a lead storage battery is estimated by using a difference (A–B) between the integral discharge threshold A serving to demand that the use of the lead storage battery be stopped and the integral discharged capacity B.

Strictly speaking, the integral discharged capacity (discharged electric quantity) as referred to herein is an integral value of discharged capacity obtained as a result of repeated discharge of the lead storage battery under standard conditions. When the discharge is conducted under actual conditions that are different from the standard conditions, the obtained integral value of discharged capacity differs from the integral value of discharged capacity under the standard conditions.

However, in the present embodiment, the accumulated value of discharged capacity until the lead storage battery deteriorates to a level by repetitions of discharge under an actual condition is replaced with the accumulated value of discharged capacity of the lead storage battery until when the lead storage battery would deteriorate, under the standard condition, to the same level as said deterioration level under the actual condition and then the replaced accumulated value is assumed as an integral discharged capacity B.

The lead storage battery used in the present embodiment is used with alternate repeated charging and discharging. Lead dioxide ($PbO_2$) is typically used as a positive electrode active material of a lead storage battery. The inventors have discovered that the variation of utilization (ratio of actual use in a battery reaction) of the lead dioxide correlates stronger with the integral discharged capacity than with the number of charge-discharge cycles. Because the lead dioxide is refined by repeated volume changes, namely, contraction (charge) and expansion (discharge), electrochemical reactivity in lead dioxide changes. Therefore, according to the discovery made by the inventors, the advancement of lead dioxide refinement can be supposed to correlate stronger with the accumulated value (that is, the integral discharged capacity) of volume changes of lead dioxide (volume changes caused by expansion of lead dioxide) than with a simple number of charge and discharge cycles. Therefore, in accordance with the present invention, the remaining service life of the lead storage battery can be estimated with better accuracy by subtracting the integral discharged capacity B (accumulated value of volume changes in the lead dioxide) that is calculated by replacing the accumulated value of discharged capacity when the lead storage battery deteriorates to a level under the actual conditions including the actually measured values of the surface temperature, the charge current, and the discharge current of the lead storage battery with an accumulated value of discharged capacity when the lead storage battery would deteriorate under said standard condition to substantially the same level as said deterioration level under the actual condition, from the integral discharge threshold A serving to demand that the use of the lead storage battery be stopped. Further, the distance that can be traveled by a transport vehicle can be also estimated.

The above-discussed life estimation method for a lead storage battery of the first embodiment will be described below with reference to FIG. 1. The life estimation method for a lead storage battery of the first embodiment is realized by a life estimation processing performed by power source systems S1 and S2 shown in FIGS. 16 and 17.

The life estimation processing shown in FIG. 1 is performed by an estimation unit (microcomputer 4; referred to hereinbelow as "estimation unit 4") of the power source systems S1 and S2 each time a charge cycle that immediately follows a discharge cycle of the lead storage battery is completed (see FIGS. 16 and 17). The estimation unit 4 stores in advance the integral discharge threshold A (step S1; storage step) and calculates the integral discharged capacity B (step S2: calculation step). Then, the estimation unit 4 subtracts the integral discharged capacity B from the integral discharge threshold A and obtains a differential electric quantity A–B (step S3; subtraction step).

The estimation unit 4 then finds a ratio {(A–B)/A} of the differential electric quantity A–B obtained in step S3 to the integral discharge threshold A (step S4; ratio acquisition step). The estimation unit 4 then estimates the estimated remaining service life of the lead storage battery from the found ratio {(A–B)/A} (step S5). In this case, the continuous processing composed of steps S4 and S5 represents an estimation step.

The ratio {(A–B)/A} found by the above-described processing comes close to 1 when the integral discharged capacity B comes close to 0. Where the integral discharged capacity B comes close to the A, the ratio {(A–B)/A} comes close to 0. Therefore, because the integral discharged capacity B does not come close to the integral discharge threshold A as the ratio {(A−B)/A} comes close to 1, the estimation unit 4 can estimate a long estimated remaining service life of the lead storage battery. By contrast, because the integral discharged capacity B comes close to the integral discharge threshold A as the ratio {(A−B)/A} comes close to 0, the estimation unit 4 can estimate a short estimated service life of the lead storage battery. Further, when the lead storage battery is then discharged (YES of step S20), the estimation unit 4 conducts the processing represented by step S21 of the calculation step S2, finds the ratio {(A−B)/A} in a similar manner, and estimates the remaining service life at this point in time.

Where the estimation unit 4 can refer to a table in which the ratio {(A−B)/A} is associated with a period serving as a life of the lead storage battery, the estimation unit 4 can estimate the period serving as a life of the lead storage battery. For example, where the estimation unit 4 refers to the table after finding the ratio {(A−B)/A} and obtains a period corresponding to the ratio, the estimation unit can estimate a specific period of the remaining service life.

Further, where the estimation unit 4 multiplies or adds a predetermined coefficient that has been set in advance to the ratio {(A−B)/A}, the estimation unit 4 may estimate the period serving as a life of the lead storage battery.

A specific feature of the second embodiment is that in the procedure of the first embodiment, a coefficient is multiplied by the discharged capacity obtained for each discharge cycle and the value obtained is accumulated, thereby calculating the integral discharged capacity B. In other words, a specific feature of the second embodiment is that a value is found that is obtained by multiplying the discharged capacity representing the capacity that has been discharged by the coefficient for each discharge cycle of the lead storage battery in the calculation step shown in the above-described step S2, and the value obtained by multiplying the discharged capacity by the coefficient is sequentially accumulated, thereby calculating the integral discharged capacity B.

Although the aforementioned accumulation of volume changes in lead dioxide is the main factor determining the life of lead storage batteries, the life is also affected by other factors (described below in greater detail) that affect electrochemical reactivity. The effect of these factors varies between the discharge cycles and is difficult to control as a unified numerical value. Accordingly, the integral discharged capacity B that represents an accumulated value of a discharged capacity of the lead storage battery under the actual conditions such as giving deterioration that same order as that occurring when the lead storage battery is repeatedly discharged under the standard conditions, is calculated by multiplying a discharged capacity obtained for each discharge cycle by a coefficient that has been set based on actual discharge conditions and accumulating the value obtained as shown by Equation (1) below.

As a result, the integral discharged capacity B is obtained that takes into account the effect of factors affecting the electrochemical reactivity of the lead storage battery, and a remaining service life under actual conditions of the lead storage battery that include factors affecting the electrochemical reactivity of the lead storage battery is estimated. Therefore, the usage limit of the lead storage battery can be evaluated correspondingly to the actual usage conditions of the lead storage battery, that is, with better accuracy.

The standard conditions as referred to herein are conditions with preset values of surface temperature, charge current, and discharge current of the lead storage battery. The actual conditions as referred to herein are conditions with actually measured values of surface temperature, charge current, and discharge current of the lead storage battery.

$$B=x_1B_1+x_2B_2+\ldots+x_nB_n \qquad (1)$$

Here, 1, 2, . . . n are numbers assigned to each discharge cycle of the lead storage battery, $B_1$ to $B_n$ are discharged capacities during each discharge cycle, $x_1$ to $x_n$ are coefficients for multiplying the discharged capacity in each discharge cycle.

Equation (1) above can be represented as the following Formula 1.

[Formula 1]

$$B=\sum_{i=1}^{n} x_iB_i$$

The above-discussed life estimation method for a lead storage battery of the second embodiment will be described below with reference to FIG. 2. The life estimation method for a lead storage battery of the second embodiment is realized by a life estimation processing performed by power source systems S1 and S2 shown in FIGS. 16 and 17.

Figure 2:
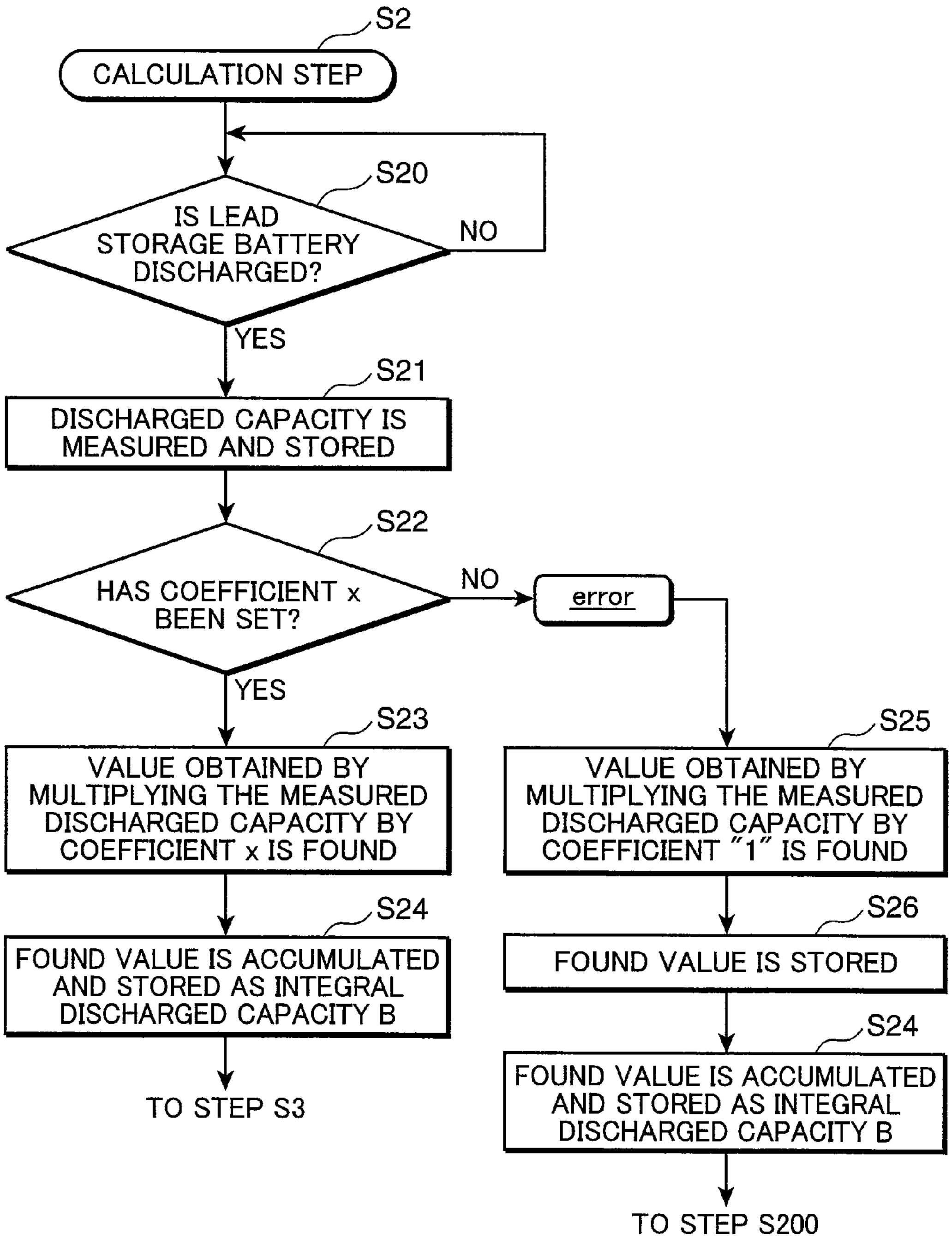
FIG. 2 is a flowchart illustrating an example of processing of calculating the integral discharge electricity amount B.
Figure 16:
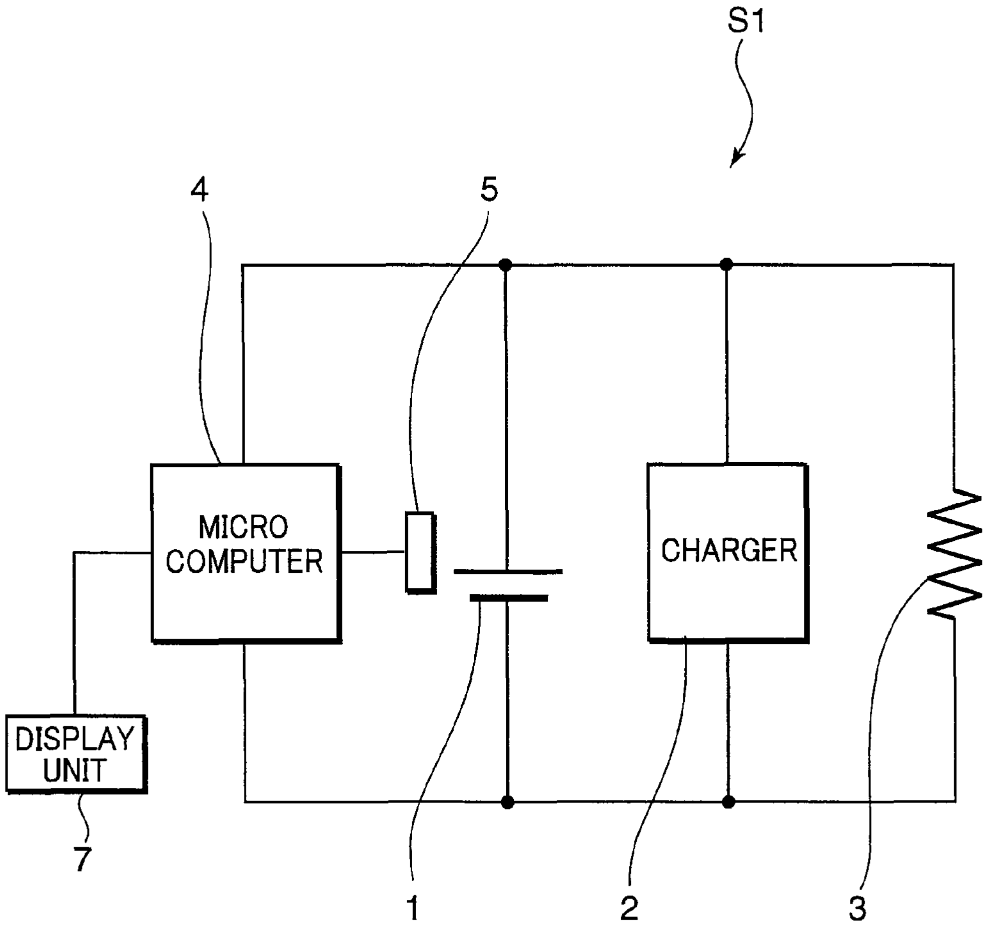
FIG. 16 is a block diagram illustrating an example of a power source system according to the present invention.
Figure 17:
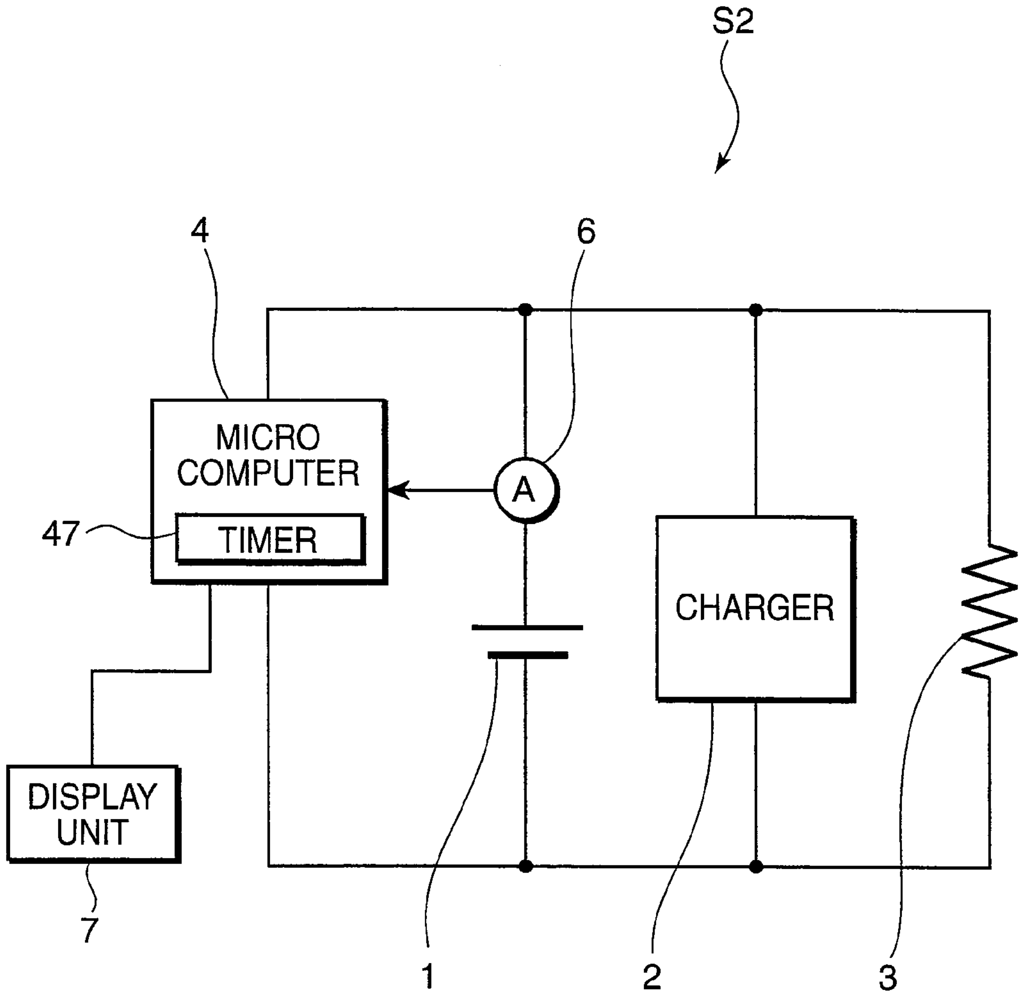
FIG. 17 is a block diagram illustrating another example of a power source system according to the present invention.

The calculation step shown in FIG. 2 is performed by the estimation unit 4 of the power source systems S1 and S2 (see FIGS. 16 and 17). The estimation unit 4 performs the processing shown in steps S20 to S26.

Where the lead storage battery is discharged (YES in step S20), the estimation unit 4 measures the discharged capacity in the corresponding discharge cycle by accumulating the discharge current by the discharge time and stores the value obtained (step S21). Where the coefficient x has been set by the below-described processing (YES in step S22), the estimation unit 4 finds a value obtained by multiplying the measured discharged capacity by the coefficient x in the corresponding discharge cycle (step S23), accumulates the found value, and stores the value obtained as the integral discharged capacity B (step S24). Where the coefficient x has not been set by the below-described processing (NO in step S22), a predetermined error processing is performed. The error processing is performed by a first processing unit 471 to a fifth processing unit 475 (see FIG. 18).

In the error processing, the coefficient x that has not been set is assumed to be 1, a value is found that is obtained by multiplying the discharged capacity measured in step S21 by this coefficient "1", and the value obtained is stored (steps S25 and S26). The estimation unit 4 then accumulates the value obtained by taking the coefficient as "1" and multiplying the discharged capacity by this coefficient and stores the value obtained as the integral discharged capacity B (step S24).

Thus, even in the case in which the coefficient x has not been set, the estimation unit 4 accumulates the value obtained by assuming that the coefficient x that has not been set is "1" and multiplying the discharged capacity by the coefficient. Therefore, the error of the accumulated value of the discharged capacity of the lead storage battery under the actual conditions is decreased by comparison with that in a case where the value of the discharged capacity measured when the coefficient has not been set is destroyed.

Figure 3:
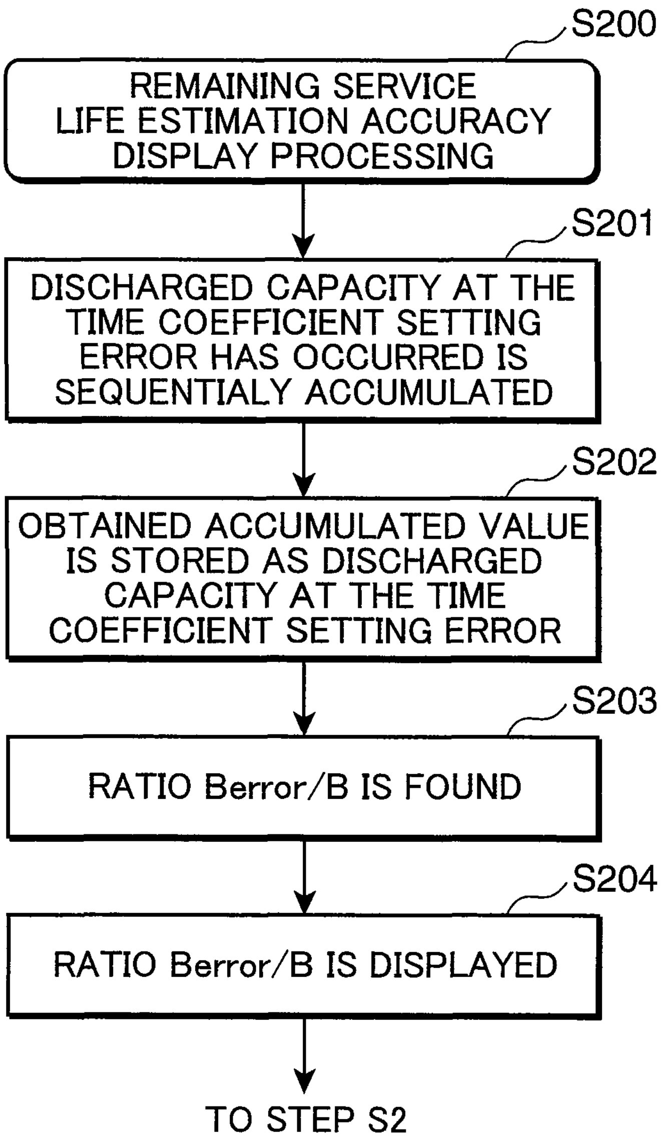
FIG. 3 is a flowchart illustrating an example of remaining service life estimation accuracy display processing.

Then, the estimation unit 4 performs the processing shown in steps S200 to S204 of FIG. 3. In other words, the estimation unit 4 performs a remaining service life estimation accuracy display processing that informs the user about the accuracy of estimating the remaining service life of the lead storage battery.

This processing informs the user about the estimation accuracy of the remaining service life by the value of a ratio of the accumulated value (discharged capacity Berror) obtained by sequentially accumulating of only the discharged capacity measured when the coefficient setting error has occurred and the integral value (integral discharged capacity B) obtained by sequentially accumulating of the measured discharged capacity, without distinguishing as to whether the coefficient setting error has occurred.

FIG. 3 is a flowchart illustrating an example of such remaining service life estimation accuracy display processing. The estimation unit 4 sequentially accumulates (step S201) the discharged capacity measured when the coefficient setting error has occurred (when the coefficient x has not been set in step S22). The estimation unit 4 stores the obtained accumulated value as the coefficient error integral discharged capacity Berror (step S202).

Then, the estimation unit 4 finds a value of the ratio Berror/B of the coefficient error integral discharged capacity Berror to the preceding integral discharged capacity B and displays the found value at a display unit 7 (see FIGS. 16 and 17) (steps S203 and S204). Where the above-described remaining service life estimation accuracy display processing is completed, the estimation unit returns to the processing of step S2 shown in FIG. 3.

Thus, in a case in which the coefficient x has not been set, the estimation unit 4 performs the remaining service life estimation accuracy display processing. Therefore, the user can judge the share of the coefficient error integral discharged capacity Berror in the integral discharged capacity B and recognize the accuracy of remaining service life estimation.

For example, where the share of the coefficient error integral discharged capacity Berror in the integral discharged capacity B is close to "1", it is clear that the coefficient determined by the factors affecting the service life of the lead storage battery has not been taken into account in the estimation of the remaining service life. Therefore, the estimation accuracy of the remaining service life is determined to be low. By contrast, where the share of the coefficient error integral discharged capacity Berror in the integral discharged capacity B is close to "0", the coefficient is determined to have been taken into account in evaluating the remaining service life. Therefore the estimation accuracy of the remaining service life is determined to be high.

The integral discharged capacity B calculated in the above-described calculation step is used in step S3 (subtraction step) shown in FIG. 1.

As shown hereinabove, the discharged capacity obtained for each discharge cycle is multiplied by the coefficient x and the value obtained is accumulated to calculate the integral discharged capacity B. Therefore, the integral discharged capacity B is found that represents a value obtained by accumulating the capacity delivered from the lead storage battery to the outside. Therefore, with the second embodiment, the electric quantity that has been cumulatively delivered from the lead storage battery to the outside can be determined with good accuracy. Therefore, the usage limit of the lead storage battery can be evaluated with good accuracy.

A specific feature of the below-described third to twelfth embodiments is in conducting a processing of setting the coefficient x used in the second embodiment. The third to twelfth embodiments will be described below using FIGS. 4 to 15, respectively, with respect to the number and method for setting the coefficient x.

A specific feature of the third embodiment is that in the procedure of the second embodiment, a first coefficient setting unit 450 of the estimation unit 4 (see FIG. 18) sets the coefficient x correspondingly to the temperature (for example, surface temperature) of the lead storage battery in the discharge. A specific feature of the fourth embodiment is that in the procedure of the third embodiment, the first coefficient setting unit 450 increases the coefficient x as the temperature of the lead storage battery rises. The service life of the lead storage battery is generally known to decrease when the temperature of a lead storage battery is high because the lead storage battery can be easier overcharged. Thus when a lead storage battery is charged at a high temperature, a corrosion reaction advances in a lead lattice and the battery tends to be easily overcharged. For this reason, when the temperature of the lead storage battery in the discharge is high, the temperature of the lead storage battery at the time the next charging is started is still high and the battery can be easily overcharged, thereby shortening the remaining service life of the lead storage battery. Therefore, the remaining service life of the lead storage battery can be estimated with better accuracy by setting a large coefficient x when the temperature of the lead storage battery in the discharge is high, thereby reflecting the aforementioned trend.

Figure 4:
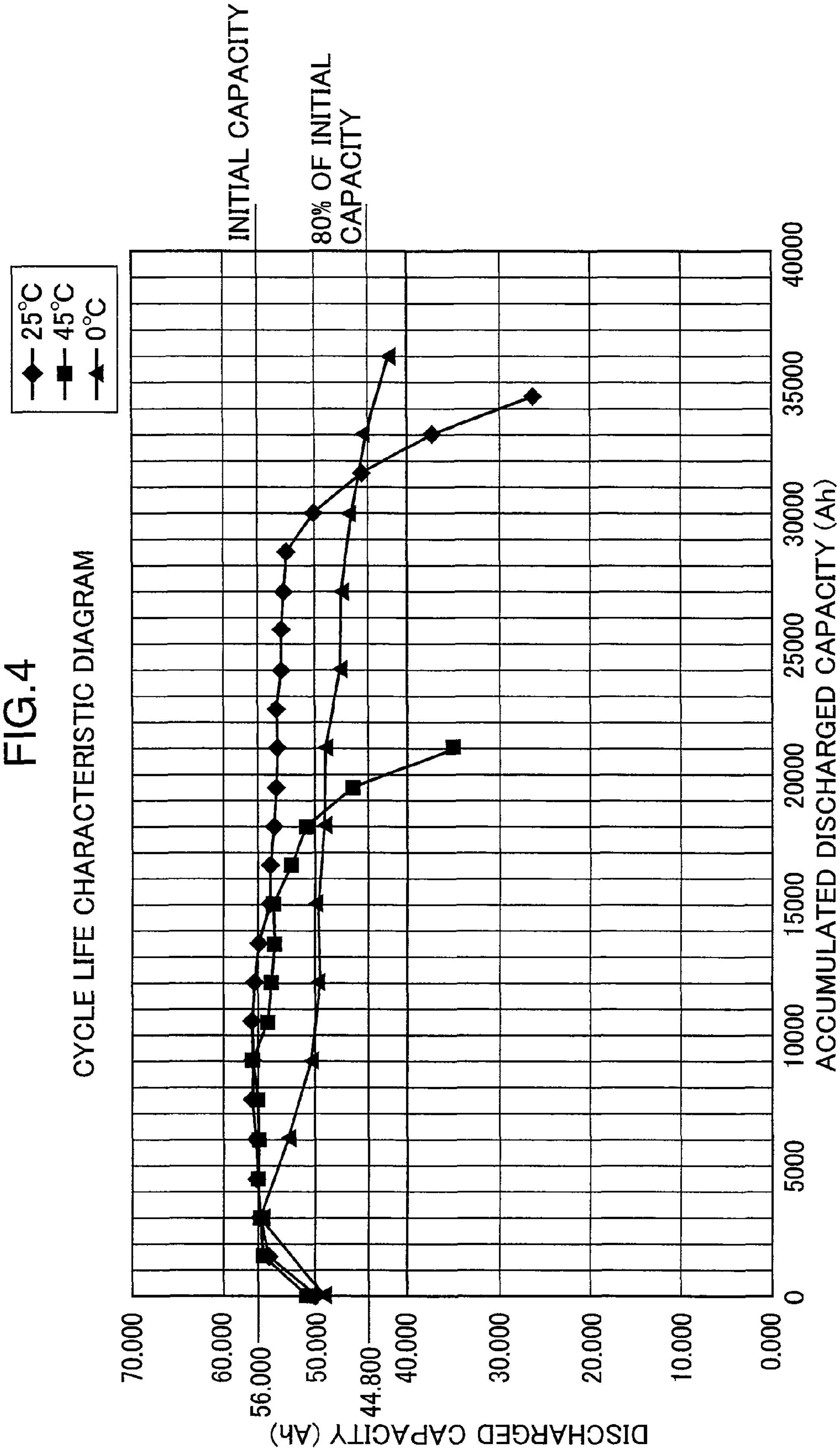
FIG. 4 illustrates an example of a cycle life characteristic of a lead storage battery.

FIG. 4 shows a cycle life characteristic of a lead storage battery with a nominal voltage of 12 V (a lead storage battery of a control valve system for EV manufactured by Panasonic) in which six cells each having a 3 hour rate rated capacity (a discharged capacity generated as the voltage of the lead storage battery reaches the preset discharge end voltage when the lead storage battery is discharged under the conditions of a surface temperature of the lead storage battery of 25 degrees and a discharge current of 3 hour rate; same hereinbelow) of 60 Ah are connected in series. The cycle life was determined by the below-described test under conditions with a different surface temperature of the lead storage battery. Thus, a charge of 36 Ah at 6 A (10 hour rate) and a discharge of 30 Ah at 20 A (3 hour rate) were repeatedly conducted, a discharged capacity of 56 Ah at a point of time with the integral discharged capacity B of 3000 Ah was taken as the initial capacity (initial electric quantity), and a point of time in which the discharged capacity decreased to 80% (44.8 Ah) of the initial capacity of 56 Ah was determined as a service life.

In the present description hereinbelow, the 3 hour rate rated capacity of 60 Ah means that a discharged capacity, generated during the voltage of the lead storage battery reaches the preset discharge end voltage when the lead storage battery is discharged under the conditions of a surface temperature of the lead storage battery of 25 degrees and a discharge current of 3 hour rate, is 60 Ah.

As follows in FIG. 4, where the determination is made based on the integral discharged capacity B until the end of life is reached at 25° C., the integral discharged capacity B until the end of life is reached at 0° C. is larger than the integral discharged capacity B until the end of life is reached at 25° C. The integral discharged capacity B until the end of life is reached at 45° C. is less than the integral discharged capacity B until the end of life is reached at 25° C.

As shown hereinabove, the integral discharged capacity B until the end of life is reached shifts from the integral discharged capacity B at 25° C. as the temperature changes. FIG. 4 shows that the integral discharged capacity B can be experimentally represented as shown below. Where the integral discharged capacity B until the end of life is reached at 25° C. is taken as 1, the integral discharged capacity B until the end of life is reached at 0° C. can be represented as 1/0.914. Further, where the integral discharged capacity B until the end of life is reached at 25° C. is taken as 1, the integral discharged capacity B until the end of life is reached at 45° C. can be represented as 1/1.600.

Thus, the integral discharged capacity B until the end of life is reached decreases as the temperature rises and the integral discharged capacity B until the end of life is reached increases as the temperature lowers because a high temperature enhances the corrosion reaction of the lead lattice, whereas a low temperature does not enhance the corrosion reaction of the lead lattice.

In the present embodiment, a denominator of the integral discharged capacity B until the end of life is reached at each temperature that is obtained experimentally by taking the integral discharged capacity B until the end of life is reached at 25 degrees as 1 is taken as a coefficient x. Thus, because the denominator of the integral discharged capacity B at 0° C. is 0.914, the coefficient x at 0° C. is taken as 0.914. Further, because the denominator of the integral discharged capacity B at 45° C. is 1.600, the coefficient x at 45° C. is taken as 1.600. The temperature-coefficient correlation diagram shown in FIG. 5 is obtained by conducting the above-described test by successively changing the surface temperature of the lead storage battery and taking as the coefficient x a denominator of the integral discharged capacity B until the end of life is reached at each temperature that is obtained experimentally by taking the integral discharged capacity B until the end of life is reached at 25 degrees as 1.

Figure 5:
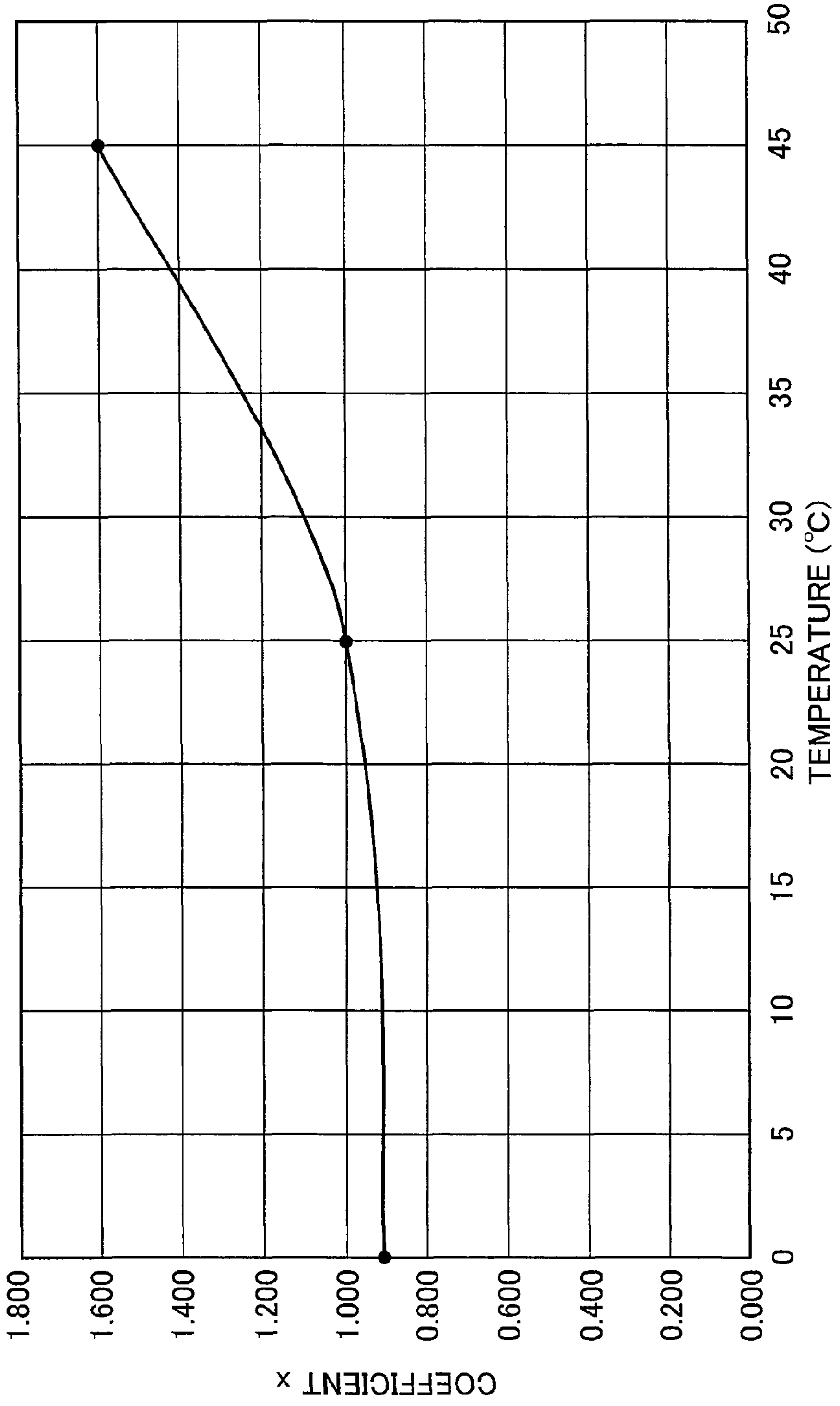
FIG. 5 illustrates an example of correlation between a charge current and a coefficient of a lead storage battery.

The temperature-coefficient correlation diagram shown in FIG. 5 is obtained by plotting the coefficient x against the temperature. The estimation conducted in the third and fourth embodiments reflects the variation in coefficient estimated from the temperature-coefficient correlation diagram shown in FIG. 5 and the remaining service life of the lead storage battery is estimated with good accuracy. In other words, where the surface temperature of the lead storage battery is determined, the first coefficient setting unit 450 acquires the coefficient x corresponding to this surface temperature from the temperature-coefficient correlation diagram shown in FIG. 5 and sets the acquired coefficient x.

In the above-described third embodiment, the first coefficient setting unit 450 can also set a larger coefficient x when the surface temperature of the lead storage battery is low.

The following trend is known to be observed in a lead storage battery under conditions that can easily result in incomplete charging of the lead storage battery. Thus, when the surface temperature of a lead storage battery in a discharge cycle is low, the surface temperature of the lead storage battery is still low at a point of time in which the immediately following charge cycle is started. In this case, because charge insufficiency easily occurs in the lead storage battery, the remaining service life of the lead storage battery is shortened.

By contrast, when the surface temperature of the lead storage battery in the discharge cycle is high, the surface temperature of the lead storage battery is still high at a point of time in which the immediately following charge cycle is started. In this case, because the charge efficiency of the lead storage battery is high, the charge insufficiency is eliminated. As a result, the remaining service life of the lead storage battery is extended.

Therefore, under the conditions that easily result in insufficient charging of the lead storage battery, where the coefficient x is set higher as the surface temperature of the lead storage battery in the discharge cycle decreases in order to reflect the above-described trend, the estimation accuracy of the remaining service life of the lead storage battery is increased. For example, constant-voltage charging (14.7 V control, maximum charge current 12A, charge time 6 h) of a lead storage battery with a 3 hour rate rated capacity of 60 Ah is an example of conditions that easily result in incomplete charging of the lead storage battery.

A specific feature of the fifth embodiment is that in the procedure of the second embodiment, the second coefficient setting unit 451 of the estimation unit 4 (see FIG. 18) sets the coefficient correspondingly to the charge current in the charge cycle that immediately follows the respective discharge cycle. A specific feature of the sixth embodiment is that in the procedure of the fifth embodiment, the second coefficient setting unit 451 increases the coefficient as the charge current increases. The reason why the second coefficient setting unit 451 sets a large coefficient x when the charge current in the charge cycle immediately following the discharge cycle is high will be explained below.

Thus, because the lead storage battery is by itself a resistor, when the charge current is large, the amount of heat generated by the lead storage battery on the basis of Joule heat generation also increases. By setting a large coefficient x when the charge current in the charge cycle immediately following the discharge cycle is high in order to reflect this phenomenon, it is possible to estimate the remaining service life for the lead storage battery with good accuracy.

FIG. 6 shows a temperature difference between a temperature at the charge start of the lead storage battery and a charge end for the lead storage battery in a case where the above-described lead storage battery is charged at various charge currents under a 25° C. environment. In other words, FIG. 6 shows a charge current value-temperature difference correlation diagram.

FIG. 6 demonstrates that the temperature difference (temperature rise at the charge end) between the temperature of the lead storage battery at the charge end and the temperature of the lead storage battery at the charge start increases with the increase in the value of the charge current represented by the hour rate. Therefore, it is clear that when the charge current is larger, heat generation caused by Joule heat generated in the lead storage battery increases. Accordingly, when the temperature dependence of coefficient x that is shown in the fourth embodiment (see FIG. 5) has been determined, the estimation unit 4 can conduct the following processing.

Thus, the estimation unit 4 assumes that the temperature-coefficient correlation diagram shown in FIG. 5 is obtained by plotting the coefficient x against the temperature under conditions of charging the lead storage battery at a charge current of 10 hour rate. Further, the estimation unit 4 also assumes that the temperature (° C.) shown in FIG. 5 corresponds to the temperature difference (temperature rise at the charge start) between the temperature of the lead storage battery at the charge end and the temperature of the lead storage battery at the charge start under conditions of charging the lead storage battery at a charge current of 10 hour rate.

Under such conditions, the estimation unit 4 finds the difference between the temperature rise at the charge end in a case of charging at a 10 hour rate and the end temperature rise at the charge end corresponding to various charge current values shown in FIG. 6. As a result, the "difference with temperature rise at charge end in case of 10 hour rate" shown in the rightmost column of the table in FIG. 6 is obtained.

Further, because a value of 15° C. is obtained as the "difference with temperature rise at charge end in case of 10 hour rate" when the hour rate is 1, as shown in FIG. 6, the estimation unit 4 can assume that the lead storage battery has been charged not at 25° C., but at 40° C. obtained by adding 15° C. As a result, a value of about 1.43 is obtained as the coefficient x corresponding to 40° C. from the temperature-coefficient correlation diagram shown in FIG. 5.

Likewise, because a value of 0° C. is obtained as the "difference with temperature rise at charge end in case of 10 hour rate" when the hour rate is 10, the estimation unit 4 assumes that the lead storage battery has been charged under conditions of 25° C., which is an actual temperature. Thus, 1 is obtained as the coefficient x corresponding to 25° C. from the temperature-coefficient correlation diagram shown in FIG. 5.

Figure 7:
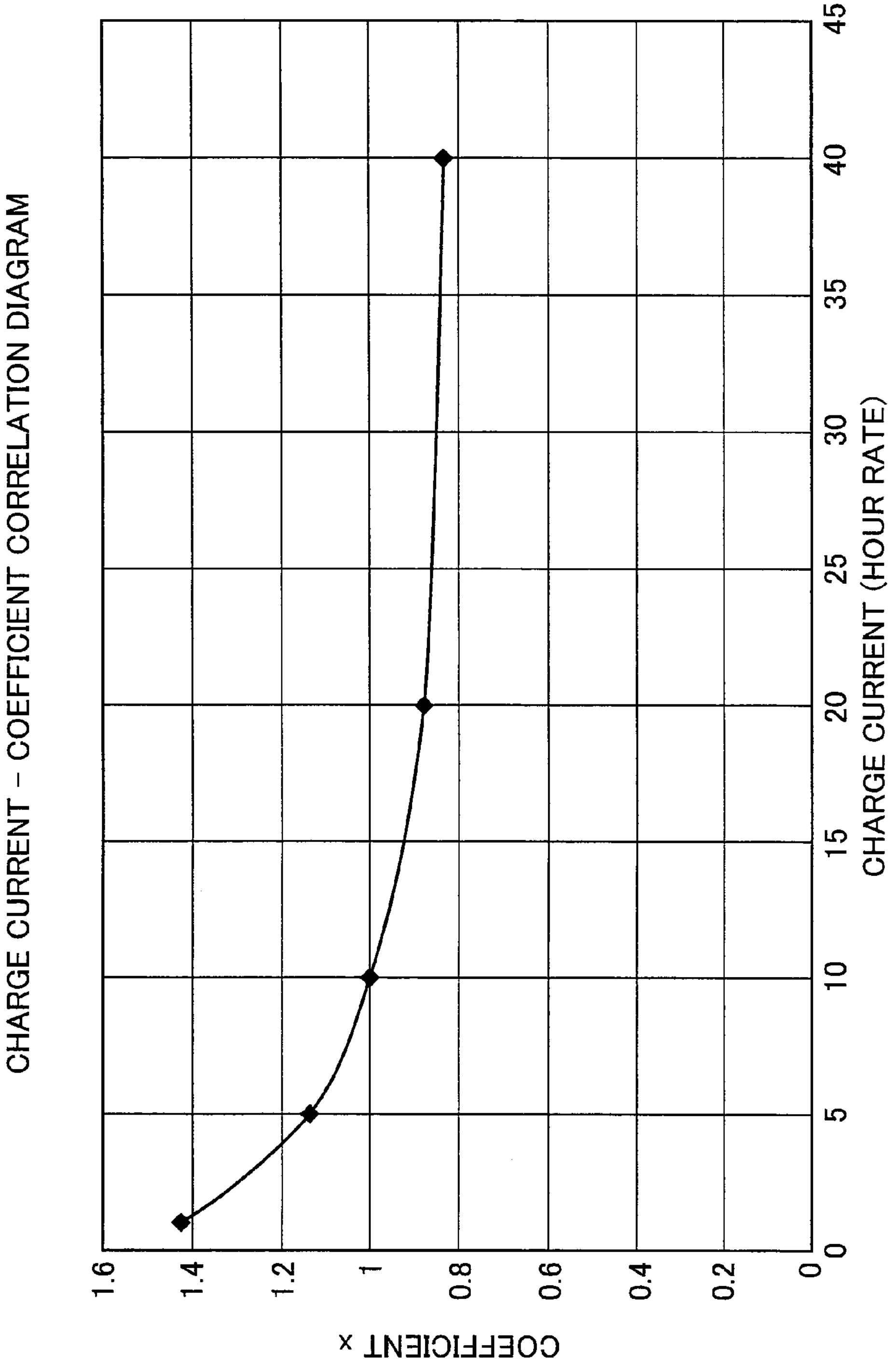
FIG. 7 illustrates an example of correlation between a charge current and a coefficient of a lead storage battery.

Likewise, because a value of −7° C. is obtained as the "difference with temperature rise at charge end in case of 10 hour rate" when the hour rate is 40, as shown in FIG. 6, the estimation unit 4 can assume that the lead storage battery has been charged not at 25° C., but at 18° C. obtained by subtracting 7° C. As a result, a value of about 0.92 is obtained as the coefficient x corresponding to 18° C. from the temperature-coefficient correlation diagram shown in FIG. 5.

Where the estimation unit 4 associates the values of coefficients x obtained by conducting the above-described processing with respect to each hour rate with the assumed temperature and plots them against each other, the charge current-coefficient correlation diagram shown in FIG. 7 can be obtained. Therefore, by obtaining the coefficient x corresponding to the charge current from the charge current-coefficient correlation diagram shown in FIG. 7, the estimation unit 4 can estimate the remaining service life of the lead storage battery with better accuracy.

In the fifth and sixth embodiments, a charge current is measured instead of the surface temperature of the lead storage battery that is measured in the third and fourth embodiments, the surface temperature is estimated from the charge current, and the coefficient x is found from the estimated surface temperature. By combining such fifth and sixth embodiments with the third and fourth embodiments, it is possible to realize highly accurate estimation of the remaining service life by the coefficient x corresponding to the charge current even when the coefficient x corresponding to the surface temperature could not be set due to an error.

Figure 8:
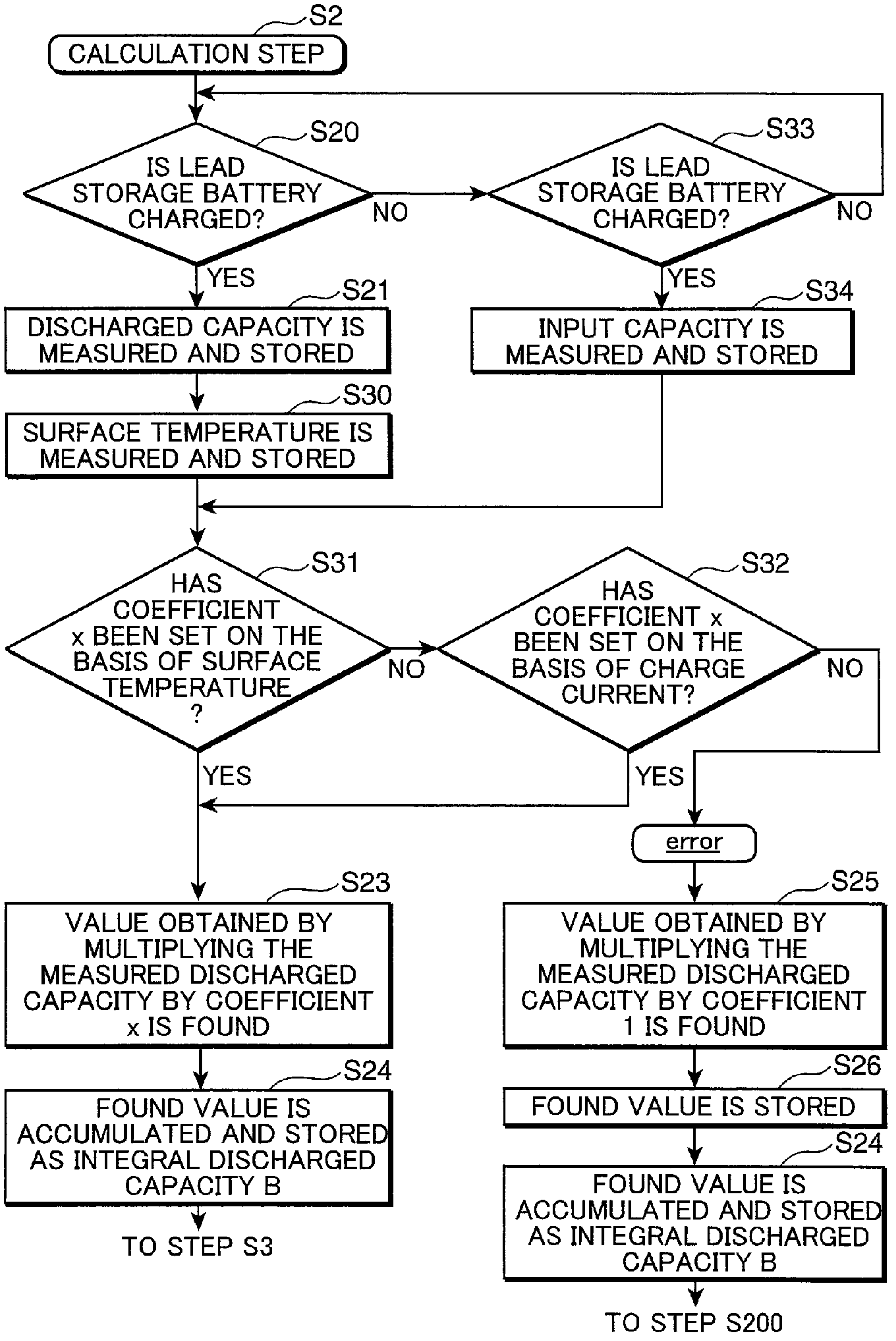
FIG. 8 is a flowchart illustrating an example of calculation processing of integral discharged capacity B when the fifth and sixth embodiments are combined with the third and fourth embodiments.
Figure 9:
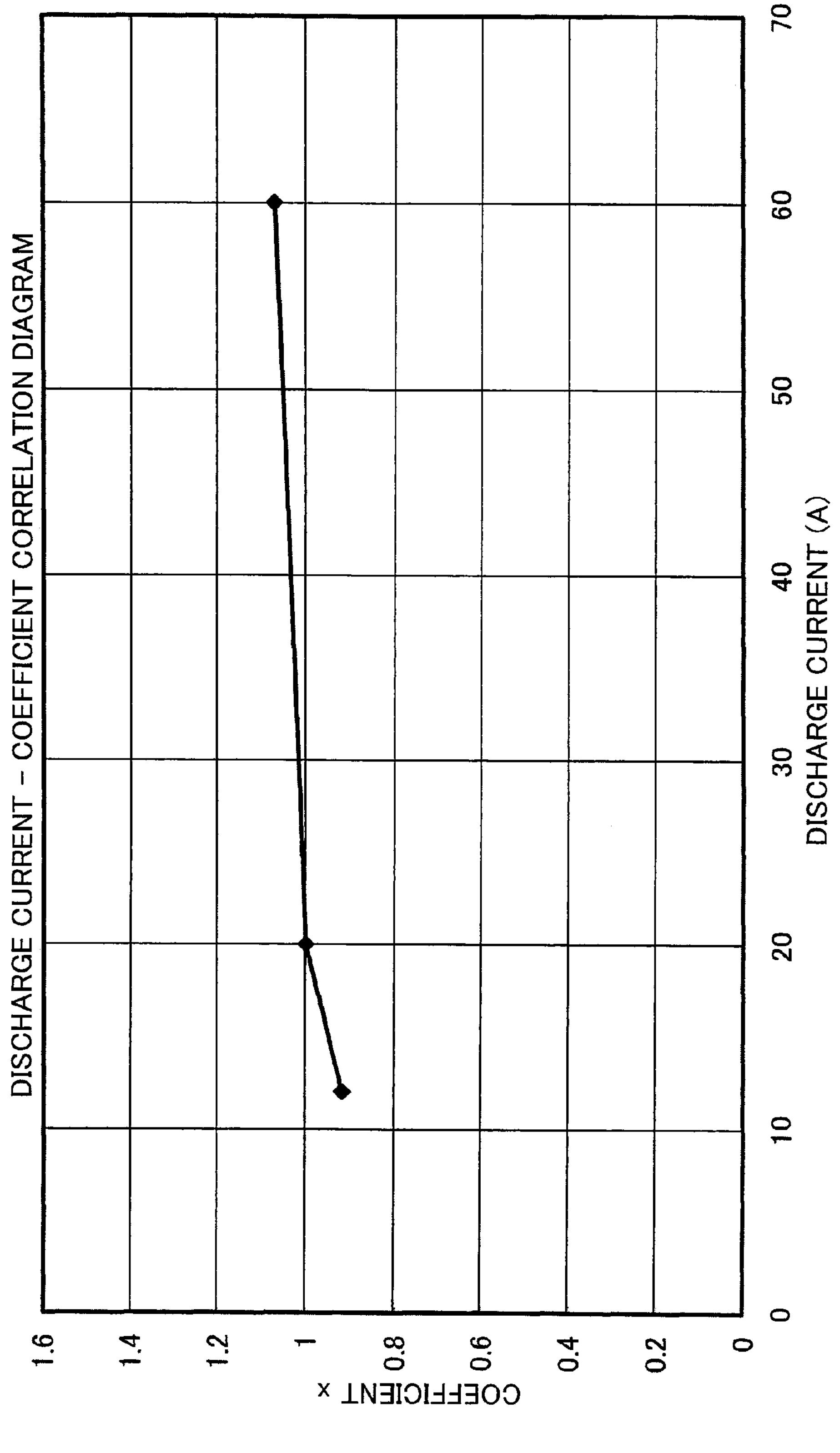
FIG. 9 illustrates an example of correlation between a charge current and a coefficient of a lead storage battery.
Figure 10:
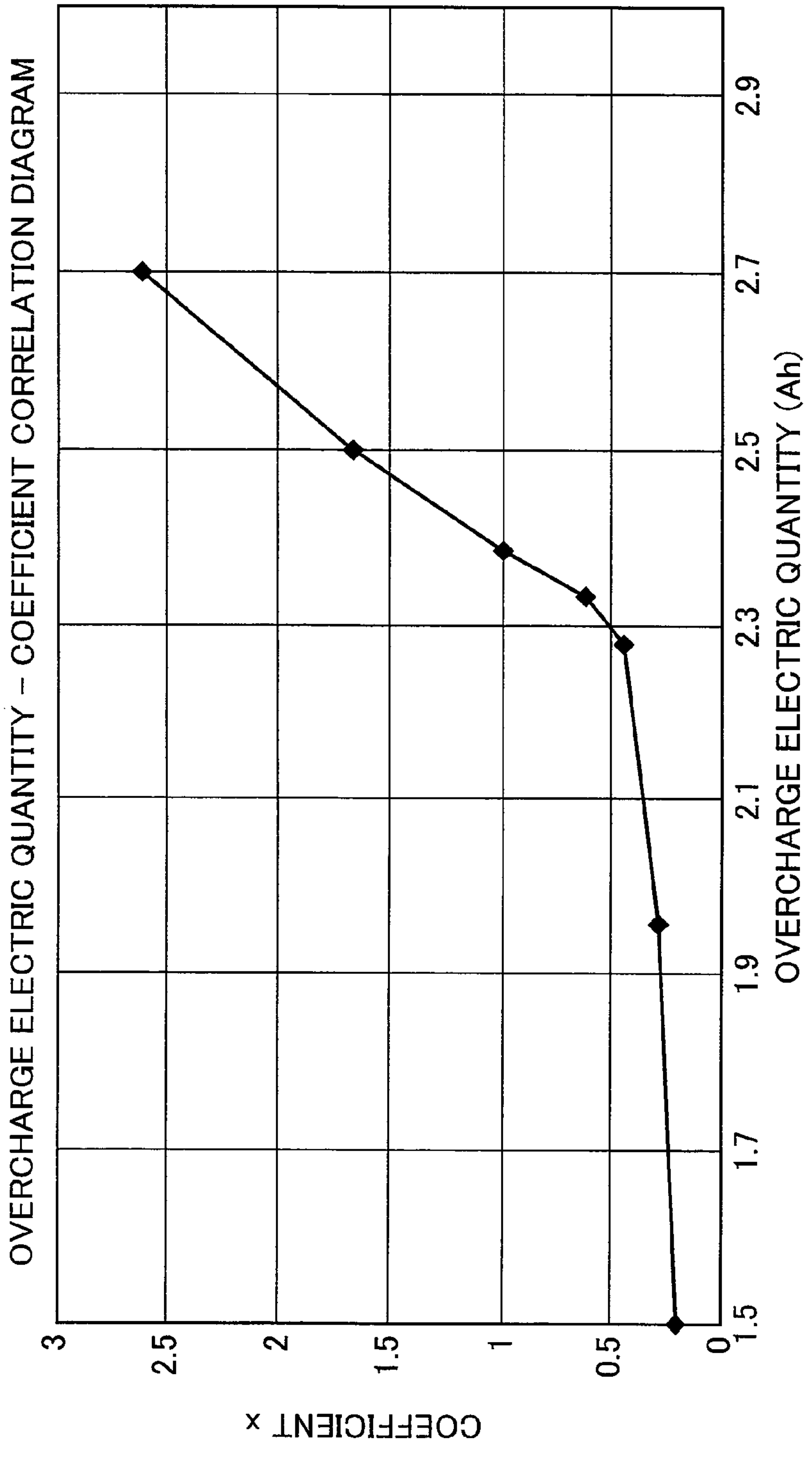
FIG. 10 illustrates an example of correlation between an overcharge electric quantity and a coefficient.

FIG. 8 is a flowchart illustrating an example of a calculation processing of the integral discharged capacity B in the case where the fifth and sixth embodiments are combined with the third and fourth embodiments.

Where the lead storage battery is discharged (YES in step S20), the estimation unit 4 measures the discharged capacity in the corresponding discharge cycle by integrating the discharge current by the discharge time and stores the result obtained (step S21). Then, the estimation unit 4 measures and stores the surface temperature of the lead storage battery (step S30). When the lead storage battery is charged rather than discharged (NO in step S20 and YES in step S33), the estimation unit 4 measures and stores the charge current (step S34).

When the setting of the coefficient x based on the aforementioned surface temperature has been made (YES in step S31), the estimation unit 4 finds a value obtained by multiplying the measured discharged capacity by the set coefficient x (step S23), accumulates the found value, and stores the value obtained as the integral discharged capacity B (step S24).

When the setting of the coefficient x based on the aforementioned surface temperature has not been made, the estimation unit 4 determines whether the setting of the coefficient x based on the aforementioned charge current has been made (step S32). As a result, where the setting of the coefficient x based on the aforementioned charge current has been made (YES in step S32), a value obtained by multiplying the measured discharged capacity by the set coefficient x is found (step S23), the found value is accumulated, and the value obtained is stored as the integral discharged capacity B (step S24).

In a case where neither the setting of the coefficient x based on the surface temperature nor the setting of the coefficient x based on the charge current has been made (NO in step S31 and NO in step S32), the estimation unit 4 conducts the aforementioned error processing (steps S24 to S26) and remaining service life estimation accuracy display processing (steps S200 to S204).

A specific feature of the seventh embodiment is that in the procedure of the second embodiment, a third coefficient setting unit 452 (see FIG. 18) of the estimation unit 4 sets the coefficient correspondingly to the discharge current in the respective discharge. A specific feature of the eighth embodiment is that in the procedure of the seventh embodiment, the third coefficient setting unit 452 increases the coefficient as the discharge current increases. The third coefficient setting unit 452 sets the coefficient corresponding to the discharge current from the discharge current-coefficient correlation diagram (see FIG. 9) that has been stored in advance in the estimation unit 4. The reason why the third coefficient setting unit 452 sets a larger coefficient x when the discharge current is larger will be described below.

Even in the new lead storage batteries or lead storage batteries with the same deterioration ratio, the electric quantity discharged by the discharge current is known to differ among the batteries. Further, because the lead storage battery is by itself a resistor, when the discharge current is large, heat generation in the battery caused by Joule heat becomes larger. Therefore, when no sufficient cooling is conducted after the discharge in a discharge step and before the next charge, the surface temperature of the lead storage battery during charging remains high. Where the lead storage battery is charged immediately after the discharge end while the surface temperature thereof is still high, the remaining service life of the lead storage battery is shortened, as described hereinabove. Therefore, by setting a large coefficient x when the discharge current during the discharge step is large with the object of reflecting these phenomena, it is possible to estimate the remaining service life of the lead storage battery with better accuracy.

A specific feature of the ninth embodiment is that in the procedure of the second embodiment, a fourth coefficient setting unit 453 (see FIG. 18) of the estimation unit 4 sets the coefficient correspondingly to the below-described overcharge electric quantity in a charge cycle immediately before the corresponding discharge cycle. A specific feature of the tenth embodiment is that in the procedure of the ninth embodiment, the fourth coefficient setting unit 453 increases the coefficient as the overcharge electric quantity increases. The fourth coefficient setting unit 453 sets the coefficient corresponding to the below-described overcharge electric quantity from the overcharge electric quantity-coefficient correlation diagram (see FIG. 10) that has been stored in advance in the estimation unit 4. The reason why the fourth coefficient setting unit 453 sets a large coefficient x when the overcharge electric quantity is large will be explained below with reference to FIG. 11.

Figure 11:
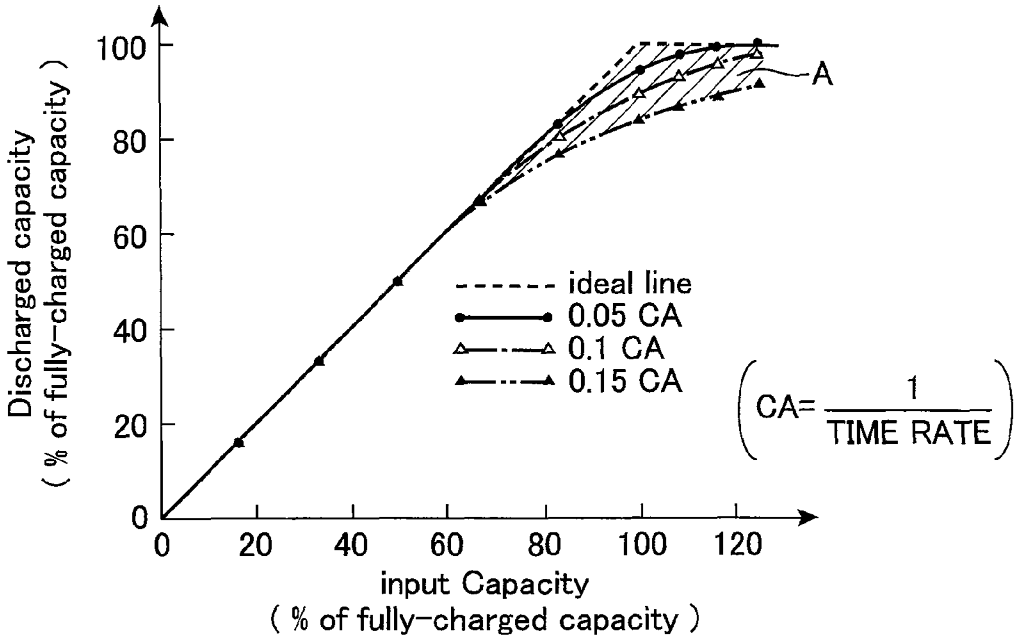
FIG. 11 illustrates an example of charge acceptance of a lead storage battery.

FIG. 11 shows a charge acceptance of a typical lead storage battery together with a difference in input capacity.

In FIG. 11, a ratio of a input capacity (Charge Input) to a theoretic fully-charged capacity is plotted against the abscissa, and a ratio of a discharged capacity (Delivered Capacity) to a theoretic fully-charged capacity is plotted against the ordinate. As shown in FIG. 11, even when the charge current is small, where the input capacity (Charge Input) is more than 80% of the theoretic fully-charged capacity (nominal capacity; same hereinbelow), a line obtained from the input capacity and discharged capacity starts deviating from an ideal line on which the input capacity and discharged capacity assume identical values, and the ratio of capacity in the charge that does not participate in the discharge of consumed power increases.

Thus, as shown in FIG. 11, even when the charge current is as small as 0.05 CA (where CA is an inverse value of an hour rate), where the input capacity exceeds 80% of the theoretic fully-charged capacity, the discharged capacity obtained is less than the discharged capacity obtained from the ideal line. Further, as shown in FIG. 11, when the charge current is 0.1CA and 0.15 CA, even when the input capacity is less than 80% of the theoretic fully-charged capacity (nominal capacity), where the input capacity is above 65% of the theoretic fully-charged capacity, the line obtained from input capacity and discharged capacity starts deviating from the ideal line. As a result, a difference occurs between the input capacity and the discharged capacity in the discharge cycle immediately after the charge at this input capacity.

This difference is called an overcharge electric quantity. This difference is found while changing the charge current within a range from 0.05 CA to 0.15 CA. The region in which the values obtained are plotted is shown by a region A represented by hatching in FIG. 11. The larger is the overcharge electric quantity, the easier occurs the deterioration caused by the corrosion of lead lattice (collector) and therefore the shorter is the life of the lead storage battery. Accordingly, the estimation unit 4 determines a SOC range in which the lead storage battery has been charged and discharged, calculates the overcharge electric quantity in a charge cycle immediately following the corresponding discharge cycle, and sets a larger coefficient x when the overcharge electric quantity is large.

The SOC determination processing performed by the estimation unit 4 and the calculation of overcharge electric quantity by the estimation unit 4 will be described below.

The estimation unit 4 can determine a SOC range in which the lead storage battery has been charged and discharged, for example, by a process in which the estimation unit 4 conducts the following processing for each completed charge-discharge cycle of the lead storage battery. Thus, the estimation unit 4 stores in advance an initial capacity (see FIG. 4), measures the discharged capacity in the discharge cycle by accumulating the discharge current by the discharge time, and measures the input capacity in the immediately following charge cycle by accumulating the charge current by the charge time. Then, the estimation unit 4 subtracts the discharged capacity from the initial capacity and then adds the input capacity. By such a processing, the estimation unit 4 determines a SOC range in which the lead storage battery has been charged and discharged.

The calculation of the overcharge electric quantity by the estimation unit 4 is realized, for example, by the following processing. Data representing the correlation between SOC and an overcharge coefficient a are stored in advance in the estimation unit 4. The overcharge coefficient a as referred to herein is a coefficient obtained by handing as a coefficient a numerical value represented by a electric quantity that has not been used in the charge reaction at each SOC. The data representing the correlation between SOC and the overcharge coefficient a are represented for example as a SOC-overcharge coefficient correlation diagram shown in FIG. 12.

The SOC-overcharge coefficient correlation diagram is obtained by a test in which a charge current of a constant value flows in states with different SOC of the lead storage battery, while the surface temperature of the lead storage battery is maintained at a constant level. In other words, the SOC-overcharge coefficient correlation diagram is obtained by a test in which the electric quantity that has not been used in the charge reaction in each SOC is found, while changing the SOC of the lead storage battery, when the surface temperature and the charge current are constant.

Figure 12:
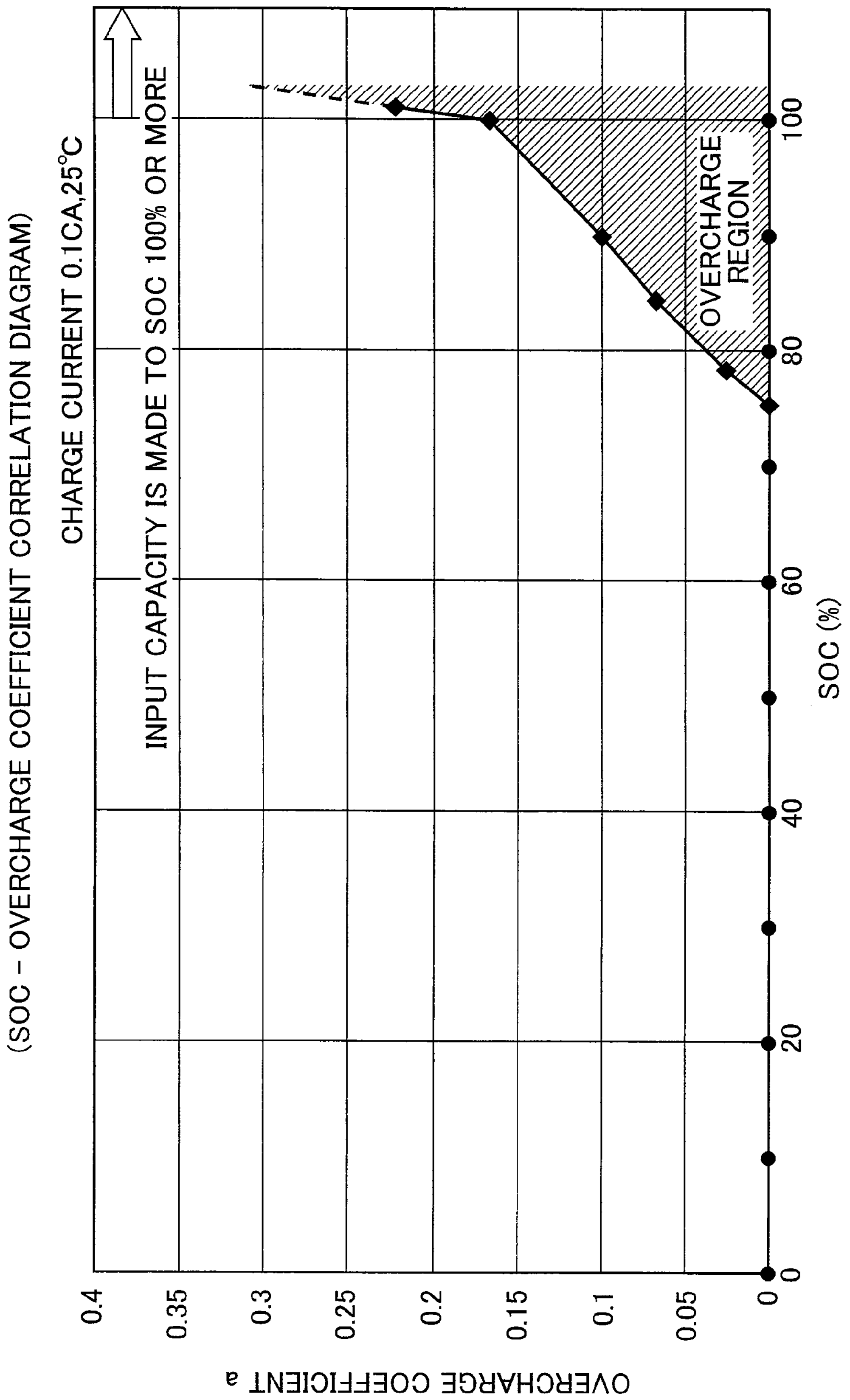
FIG. 12 illustrates an example of correlation between a SOC and an overcharge coefficient.
Figure 13:
FIG. 13 illustrates an example of correlation between a difference $C_c$–$C_{80}$ and a coefficient.

For example, the correlation diagram shown in FIG. 12 has been obtained by the following test conducted under a condition of a surface temperature of the lead storage battery of 25 degrees in the lead storage battery with a 3 hour rate rated capacity of 60 Ah. In other words, the correlation diagram shown in FIG. 12 has been obtained by a test in which the electric quantity that has not been used in the charge reaction in each SOC was found, while causing a charge current of 0.1 CA (6 A) to flow continuously in the lead storage battery and changing the SOC from a state of about 75% to a state of about 120% under the aforementioned conditions.

As shown in FIG. 12, as a result of the charge current continuously flowing in the lead storage battery, the input capacity such that the SOC exceeds 100% enters the lead storage battery. In this case, as shown by a dot line in FIG. 12, the capacity that has not been used in the charge reaction (that is, the overcharge coefficient a) increases rapidly.

The estimation unit 4 finds the overcharge electric quantity by using the data representing such a correlation between the SOC and the overcharge coefficient a. Thus, the estimation unit 4 conducts the above-described SOC determination processing by using the discharged capacity in a discharge cycle and a input capacity in a charge cycle that immediately follows the discharge cycle. As a result, the estimation unit 4 can determine a SOC range in which the battery has been charged and discharged.

The estimation unit 4 then obtains the overcharge coefficient a corresponding to the SOC in the determined range from the SOC-overcharge coefficient correlation diagram shown in FIG. 12. Then, the estimation unit 4 sequentially accumulates the values obtained by multiplying the measured input capacity by the overcharge coefficient a corresponding to each SOC in the determined range. The value obtained as a result of this processing is an overcharge electric quantity in the charge cycle immediately following the discharge cycle.

For example, a lead storage battery with a 3 hour rate rated capacity of 60 Ah is assumed to be 36 Ah charged from a state with a SOC of 50% at 0.1 CA, that is 6 A, at a surface temperature of the lead storage battery of 25 degrees centigrade.

As for the input capacity necessary to change the SOC from 50% to a state with 75% (in this example, 15 Ah) in this case, as shown by the SOC-overcharge coefficient correlation diagram in FIG. 12, the value of the overcharge coefficient a remains 0 as the SOC is changed by charging from a state with 50% to a state with 75%. Therefore, the overcharge electric quantity is 0 Ah as the SOC is charged from a state with 50% to a state with 75%.

However, where the state with the SOC of 75% is exceeded, an overcharge region is present as shown in FIG. 12. Therefore, after the state with the SOC of 75% is exceeded, the estimation unit 4 finds the overcharge electric quantity by the above-described processing.

For example, while the SOC is within a range of from 89% to 90%, the overcharge coefficient a corresponding to the SOC within this range is “0.1”. Therefore, a value obtained by multiplying a sum total (in this example, 0.6 Ah) of the input capacity measured while the SOC changes from a state with 89% to a state with 90% by the overcharge coefficient “0.1” corresponding to each SOC within the range from 89% to 90% is an overcharge electric quantity in a case the SOC is within a range from 89% to 90%.

The entire overcharge electric quantity (2.7 Ah) is found by conducting such processing within the range of SOC that exceeds 75%.

As the overcharge electric quantity increases, the electric quantity that is used by a corrosion reaction of the lead lattice or electrolysis of water contained in the electrolytic solution becomes larger than the electric quantity used for the charge reaction of the lead storage battery. Therefore, the deterioration of the lead storage battery is advanced and the remaining service life is shortened. For this reason, accurate estimation of the remaining service life of the lead storage battery is realized by setting the coefficient x corresponding to the value of the overcharge electric quantity.

A specific feature of the eleventh embodiment is that in the procedure of the second embodiment, a fifth coefficient setting unit 454 (see FIG. 18) of the estimation unit 4 sets the coefficient x correspondingly to a difference $C_c-C_{80}$, where $C_c$ stands for a input capacity in a charge cycle immediately following the respective discharge cycle and $C_{80}$ stands for a 80% value of a theoretic capacity representing the 3 hour rate rated capacity. A specific feature of the twelfth embodiment is that in the procedure of the eleventh embodiment, the fifth coefficient setting unit 454 provides the estimation unit 4 with a function of increasing the coefficient x as the difference $C_c-C_{80}$ increases.

The fifth coefficient setting unit 454 sets the coefficient x corresponding to the value of the difference "$C_c-C_{80}$" from a "$C_c-C_{80}$"-"coefficient" correlation diagram (see FIG. 13) that has been stored in advance in the estimation unit 4. The reason why the fifth coefficient setting unit 454 sets a larger coefficient x when the value of the difference $C_c$-$C_{80}$ is large will be described below.

Thus, even when the estimation unit 4 has a computation function for finding the region A shown in FIG. 11, as in the ninth and tenth embodiments, the aforementioned $C_c$ and $C_{80}$ can be found, provided that the estimation unit 4 can determine a SOC range in which the lead storage battery is charged and discharged.

For example, a lead storage battery with a 3 hour rate rated capacity of 60 Ah is assumed to be charged with a 36 Ah input capacity from a state with a SOC of 50% at 0.1 CA, that is 6 A, at a surface temperature of the lead storage battery of 25 degrees centigrade. In this case, if it is clear that charging in the aforementioned charging process proceeds from SOC 50%, then 62 Ah, which is a electric quantity obtained by adding an actual input capacity (36 Ah) to 50% (30 Ah) of 60 Ah, which is the 3 hour rate rated capacity, can be taken as the $C_c$. Meanwhile, 80% (48 Ah) of the 3 hour rate rated capacity 60 Ah can be taken as $C_{80}$.

The difference $C_c-C_{80}$ (14 Ah) is found from a value obtained by subtracting $C_{80}$ (48 Ah) from $C_c$ (62 Ah). The estimation unit 4 can determine the SOC range in which the battery has been charged and discharged by the above-described processing.

It is clear that when the value of difference $C_c-C_{80}$ is large, the degree to which the actual input capacity exceeds 80% of the 3 hour rate rated capacity is large. When the value of difference $C_c-C_{80}$ is small, the degree to which the actual input capacity exceeds 80% of the 3 hour rate rated capacity is small. Where the value of $C_c-C_{80}$ is 0 or negative, the actual input capacity does not exceed 80% of the 3 hour rate rated capacity. For this reason, the value of difference $C_c-C_{80}$ can be handled as the aforementioned overcharge electric quantity.

Therefore, by setting a larger coefficient x correspondingly to the value of difference $C_c-C_{80}$ when this difference is large, it is possible to estimate the remaining service life of the lead storage battery in a simple manner, although the estimation accuracy will be somewhat lower than in the ninth and tenth embodiments.

The cases in which the third and fourth, fifth and sixth, seventh and eighth, ninth and tenth, and eleventh and twelfth embodiments are used individually are described above, but it goes without saying that the estimation accuracy of the remaining service life of lead storage battery can be increased by using a combination of these embodiments.

Figure 14A:
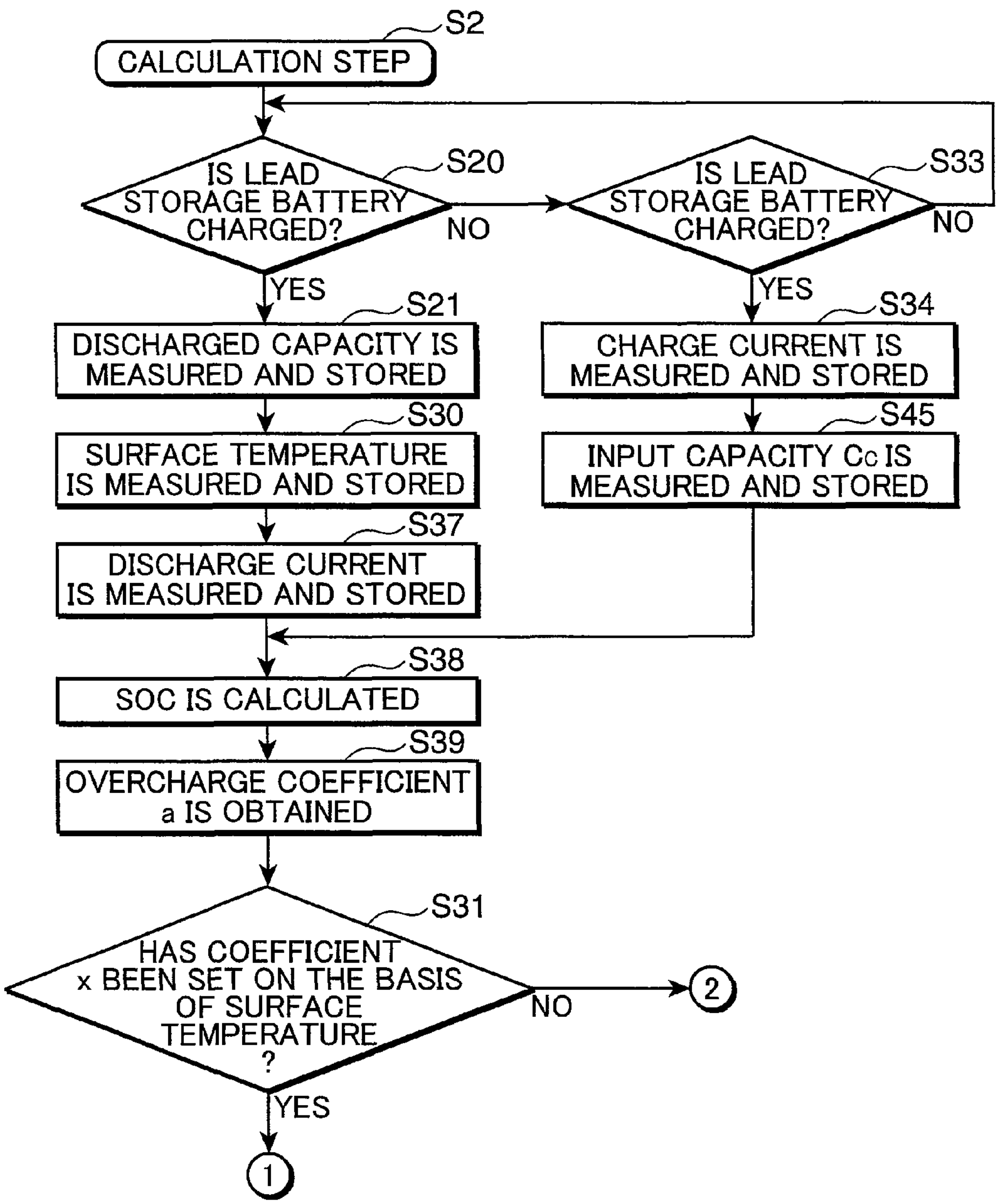
FIGS. 14A and 14B are flowcharts illustrating an example of calculation processing of integral discharged capacity B when the third to twelfth embodiments are combined.
Figure 14B:
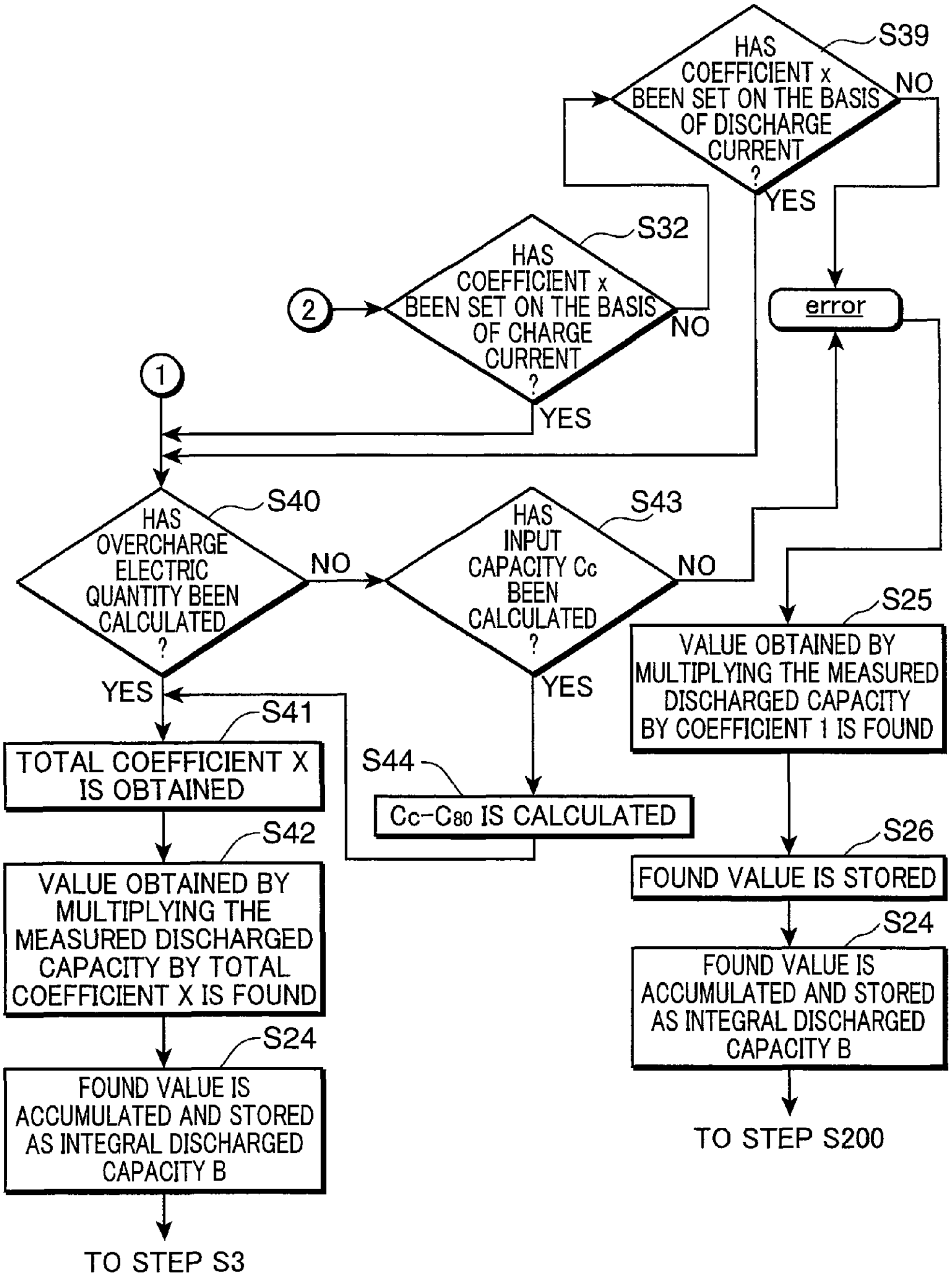

FIGS. 14A and 14B are flowcharts illustrating an example of calculation processing of the integral discharged capacity B when the third to twelfth embodiments are combined.

When the lead storage battery is discharged (YES in step S20), the estimation unit 4 measures the discharged capacity in a corresponding discharge cycle by integrating the discharge current by the discharge time and stores the result obtained (step S21). Then, the estimation unit 4 measures and stores the surface temperature of the lead storage battery (step S30), and the estimation unit 4 then measures and stores the discharge current (step S37).

Further, when the lead storage battery has been charged in the charge cycle immediately following the discharge in step S20 (NO in step S20 and YES in step S33), the estimation unit 4 measures and stores the charge current (step S34). Then, the estimation unit 4 measures the input capacity $C_c$ by integrating the measured charge current by the charge time and stores the result obtained (step S45).

By using the obtained discharged capacity and input capacity $C_c$, the estimation unit 4 then conducts the above-described SOC determination processing and determines a SOC range in which the lead storage battery has been charged and discharged (step S38). Then, the estimation unit 4 obtains each overcharge coefficient a corresponding to each SOC in the determined range (step S39).

The estimation unit 4 then determines whether the coefficient x has been set on the basis of the surface temperature of the lead storage battery (step S31). When the coefficient x has been set based on the surface temperature (YES in step S31), the estimation unit 4 conducts the below-described processing. When the coefficient x has been set based on the charge current (YES of step S32) and when the coefficient x has been set based on the discharge current (YES in step S39), the estimation unit 4 also conducts a similar processing.

Thus, the estimation unit 4 determines whether the overcharge electric quantity has been calculated by the above-described processing (step S40). Where the overcharge electric quantity has been calculated (YES in step S40), the estimation unit 4 obtains a total coefficient X, which is a coefficient corresponding to the obtained surface temperature and overcharge electric quantity, from the total coefficient diagram shown in FIG. 15 (step S41). Then, the estimation unit 4 finds a value obtained by multiplying the total coefficient X by the measured discharged capacity (step S42), accumulates the found value, and stores the result as the integral discharged capacity B (step S24).

When the overcharge electric quantity has not been calculated (NO in step S40), it is determined whether the input capacity $C_c$ has been measured (step S43). Where the input capacity $C_c$ has been measured (YES in step S43), a value of difference $C_c-C_{80}$ is calculated (step S44), and a total coefficient X corresponding to the obtained difference $C_c-C_{80}$ and surface temperature is obtained (step S41). Then, the estimation unit 4 finds a value obtained by multiplying the total coefficient X by the measured discharged capacity (step S42), accumulates the found value, and stores the result as the integral discharged capacity B (step S24).

When none of the coefficient x, overcharge electric quantity, and input capacity $C_c$ has been obtained (NO in step S31, step S32, step S39, step 40, and step S43) the estimation unit 4 conducts the above-described error processing (steps S24 to S26) and remaining service life estimation accuracy display processing (steps 5200 to S204).

The estimation unit 4 thus obtains the integral discharged capacity B by using a total coefficient corresponding to the overcharge electric quantity (or a value of difference $C_c-C_{80}$). In this case, the total coefficient diagram shown in FIG. 15 is stored in advance in the estimation unit 4. In the total coefficient diagram, the shortening of service life caused by insufficient charging is reflected in the region with a low surface temperature and a small overcharge electric quantity (or a value of difference $C_c-C_{80}$). The shortening of service life caused by corrosion of the positive electrode lattice is reflected in a region with a high surface temperature and a large overcharge electric quantity (or a value of difference $C_c-C_{80}$).

Thus, even when different factors affect the service life of a lead storage battery, the estimation accuracy of remaining service life can be increased by using the combination of a plurality of factors.

Further, even when an error occurs in setting the total coefficient X based on the surface temperature and overcharge electric quantity (or a value of difference $C_c-C_{80}$), the estimation accuracy can be increased by using another coefficient based on a difference between a charge current or discharge current and a 3 hour rate rated capacity.

The thirteenth embodiment relates to a power source system including a lead storage battery as a power source, a charger (charging device) for charging the lead storage battery, and an estimation unit that stores an integral discharge threshold A serving to demand that the use of the lead storage battery be stopped, calculates an integral discharged capacity B by accumulating a discharged capacity obtained in each discharge cycle, and estimates a remaining service life by using a difference between the integral discharge threshold A and B. A battery that is repeatedly and alternately charged and discharges is used herein as the lead storage battery 1.

Specific configurations of the thirteenth embodiment are shown as power source systems 51 and S2 in FIGS. 16 and 17. The effect of the thirteenth embodiment is similar to that of the first embodiment. The detailed configuration of the power source systems 51 and S2 shown in FIGS. 16 and 17 will be described below.

A specific feature of the fourteenth embodiment is that in the processing of the thirteenth embodiment, the discharged capacity obtained for each discharge cycle is multiplied by a coefficient, and the value obtained is accumulated to calculate the integral discharged capacity B. Specific configurations of the fourteenth embodiment are also shown as power source systems S1 and S2 in FIGS. 16 and 17. The effect of the fourteenth embodiment is similar to that of the second embodiment.

A specific feature of the fifteenth embodiment is that the configuration of the fourteenth embodiment is provided with a temperature measurement unit for measuring the temperature of the lead storage battery and the estimation unit is provided with a function of setting the coefficient correspondingly to the measured value of the temperature measurement unit. A specific feature of the sixteenth embodiment is that in the processing of the fifteenth embodiment, the estimation unit is provided with a function of increasing the coefficient when the temperature is high.

FIG. 16 is a block diagram illustrating an example of a power source system of the thirteenth to sixteenth embodiments. In a power storage system 51, the lead storage battery 1 is electrically connected to a charger (charging device) 2 for charging the lead storage battery and a load 3 composed of an electric apparatus. The lead storage battery 1 is also connected to a microcomputer 4. The microcomputer 4 is configured at least by an estimation unit and connected to a temperature measurement unit 5 that measures the surface temperature of the lead storage battery 1 in a state of proximity to the lead storage battery 1. The estimation unit (microcomputer 4) has at least the following four functions. Firstly, the estimation unit (microcomputer 4) stores the integral discharge threshold A serving to demand that the use of the lead storage battery be stopped. Secondly, the estimation unit (microcomputer 4) sets different coefficients x for the discharged capacity obtained for each discharge cycle correspondingly to the measured value of the temperature measurement unit 5. Here, the estimation unit (microcomputer 4) has a function of increasing the value of coefficient x as the surface temperature of the lead storage battery rises. Thirdly, the estimation unit (microcomputer 4) multiplies the discharged capacity obtained for each discharge cycle by the coefficient x and accumulates the value obtained, thereby calculating the integral discharged capacity B as shown in Equation 1 below. Fourthly, the estimation unit (microcomputer 4) finds a difference between the integral discharge threshold A and B (differential electric quantity A−B).

$$B=x_1B_1+x_2B_2+\dots+x_nB_n \qquad (1)$$

Here, 1, 2, . . . n are numbers assigned to each discharge cycle of the lead storage battery, $B_1$ to $B_n$ are discharged capacities during each discharge cycle, $x_1$ to $x_n$ are coefficients for multiplying the discharged capacity in each discharge cycle.

Fifthly, the estimation unit (microcomputer 4) finds a ratio {(A−B)/A} of the differential electric quantity A−B to the integral discharge threshold A. Sixthly, the estimation unit (microcomputer 4) estimates the estimated remaining service life of the lead storage battery from the found ratio {(A−B)/A}.

FIG. 16 shows only the basic configuration of the thirteenth to sixteenth embodiments, but one of the preferred modes also includes displaying the estimation results obtained with the estimation unit (microcomputer 4) on a display unit (for example, a display, electric lamps, and the like). Further, it is preferred that the estimation results of the estimation unit (microcomputer 4) be conveyed in the form of data such as wireless data, audio data, or electronic data. Here, the effects of the fifteenth and sixteenth embodiments are similar to those of the third and fourth embodiments, respectively.

A specific feature of the seventeenth embodiment is that the configuration of the fourteenth embodiment is provided with a current measurement unit that measures the charge current in a charge cycle immediately following the corresponding discharge cycle and that the estimation unit is provided with a function of setting the coefficient correspondingly to the measured value of the current measurement unit. A specific feature of the eighteenth embodiment is that in the configuration of the seventeenth embodiment, the estimation unit is provided with a function of increasing the coefficient as the charge current rises.

FIG. 17 is a block diagram illustrating an example of a power source system relating to the seventeenth and eighteenth embodiments. In the power source system S2, the lead storage battery 1 is electrically connected to a charger (charging device) 2 for charging the lead storage battery and a load 3 composed of an electric apparatus. The lead storage battery 1 is also connected to a microcomputer 4. The microcomputer 4 is configured at least by an estimation unit and connected to a current measurement unit 6 that measures the charge current of the lead storage battery 1. The estimation unit (microcomputer 4) has at least the following four functions. Firstly, the estimation unit (microcomputer 4) stores the integral discharge threshold A serving to demand that the use of the lead storage battery 1 be stopped. Secondly, the estimation unit (microcomputer 4) sets different coefficients x for the discharged capacity obtained for each discharge cycle correspondingly to the measured value of the current measurement unit 6. Here, the estimation unit (microcomputer 4) has a function of increasing the value of coefficient x as the charge current increases. Thirdly, the estimation unit (microcomputer 4) multiplies the discharged capacity obtained for each discharge cycle by the coefficient x and accumulates the value obtained, thereby calculating the integral discharged capacity B as shown in Equation 1 below. Fourthly, the estimation unit (microcomputer 4) finds a difference between the integral discharge threshold A and B (differential electric quantity A−B).

$$B=x_1B_1x_2B_2+\ldots+x_nB_n \quad (1)$$

Here, 1, 2, . . . n are numbers assigned to each discharge cycle of the lead storage battery, $B_1$ to $B_n$ are discharged capacities during each discharge cycle, $x_1$ to $x_n$ are coefficients that for multiplying the discharged capacity in each discharge cycle.

Fifthly, the estimation unit (microcomputer 4) finds a ratio {(A−B)/A} of the differential electric quantity A−B to the integral discharge threshold A. Sixthly, the estimation unit (microcomputer 4) estimates the estimated remaining service life of the lead storage battery from the found ratio {(A−B)/A}.

FIG. 17 shows only the basic configuration of the seventeenth and eighteenth embodiments, but one of the preferred modes also includes displaying the estimation results obtained with the estimation unit (microcomputer 4) on a display unit (for example, a display, electric lamps, and the like). Further, it is preferred that the estimation results of the estimation unit (microcomputer 4) be conveyed in the form of data such as wireless data, audio data, or electronic data. Here, the effects of the seventeenth and eighteenth embodiments are similar to those of the fifth and sixth embodiments, respectively.

A specific feature of the nineteenth embodiment is that the configuration of the fourteenth embodiment is provided with a current measurement unit that measures the discharge current in the corresponding discharge and that the estimation unit is provided with a function of setting the coefficient correspondingly to the measured value of the current measurement unit. A specific feature of the twentieth embodiment is that in the configuration of the nineteenth embodiment, the estimation unit is provided with a function of increasing the coefficient as the discharge current increases.

The nineteenth and twentieth embodiments can be explained with reference to FIG. 17. More specifically, the nineteenth and twentieth embodiments can be implemented by measuring the discharge current of the lead storage battery 1 with the current measurement unit 6 and providing the estimation unit (microcomputer 4) with the following functions. Firstly, the estimation unit (microcomputer 4) stores the integral discharge threshold A serving to demand that the use of the lead storage battery 1 be stopped. Secondly, the estimation unit (microcomputer 4) sets different coefficients x for the discharged capacity obtained for each discharge cycle correspondingly to the measured value of the current measurement unit 6. Here, the estimation unit (microcomputer 4) has a function of increasing the value of coefficient x as the discharge current increases. Thirdly, the estimation unit (microcomputer 4) multiplies the discharged capacity obtained for each discharge cycle by the coefficient x and accumulates the value obtained, thereby calculating the integral discharged capacity B as shown in Equation 1 below. Fourthly, the estimation unit (microcomputer 4) finds a difference between the integral discharge threshold A and B (differential electric quantity A−B).

$$B=x_1B_1+x_2B_2+\ldots+x_nB_n \quad (1)$$

Here, 1, 2, . . . n are numbers assigned to each discharge cycle of the lead storage battery, $B_1$ to $B_n$ are discharged capacities during each discharge cycle, $x_1$ to $x_n$ are coefficients for multiplying the discharged capacity in each discharge cycle.

Fifthly, the estimation unit (microcomputer 4) finds a ratio {(A−B)/A} of the differential electric quantity A−B to the integral discharge threshold A. Sixthly, the estimation unit (microcomputer 4) estimates the estimated remaining service life of the lead storage battery from the found ratio {(A−B)/A}.

FIG. 17 shows only the basic configuration of the nineteenth and twentieth embodiments, but one of the preferred modes also includes displaying the estimation results obtained with the estimation unit (microcomputer 4) on a display unit (for example, a display, electric lamps, and the like). Further, it is preferred that the estimation results of the estimation unit (microcomputer 4) be conveyed in the form of data such as wireless data, audio data, or electronic data. Here, the effects of the nineteenth and twentieth embodiments are similar to those of the seventh and eighth embodiments, respectively.

A specific feature of the twenty first embodiment is that in the configuration of the fourteenth embodiment the estimation unit is provided with a function of calculating the overcharge electric quantity in a charge cycle immediately following the corresponding discharge cycle and setting the coefficient correspondingly to the overcharge electric quantity. A specific feature of the twenty second embodiment is that in the configuration of the twenty first embodiment, the estimation unit is provided with a function of increasing the coefficient as the overcharge electric quantity increases. In this case, the overcharge electric quantity means, as described hereinbelow, a difference between the input capacity and the discharged capacity in a discharge cycle immediately after charging with the input capacity.

The twenty first and twenty second embodiments can be also explained with reference to FIG. 17. For example, as shown in FIG. 17, the twenty first and twenty second embodiments can be implemented by adding a timer 47 to the microcomputer 4 and providing the estimation unit (microcomputer 4) with the following functions. Firstly, the estimation unit (microcomputer 4) stores the integral discharge threshold A serving to demand that the use of the lead storage battery 1 be stopped. Secondly, the estimation unit (microcomputer 4) stores the overcharge region (region A represented by hatching in FIG. 11). Thirdly, the estimation unit (microcomputer 4) determines the SOC of the lead storage battery 1 and adds up the input capacity calculated as a product of the measured value of the current measurement unit 6 and the charging time measured by the timer 47, thereby calculating the SOC value after the lead storage battery 1 has been charged. Fourthly, the estimation unit (microcomputer 4) compares the aforementioned SOC value after the lead storage battery 1 has been charged with the overcharge region (region A represented by hatching in FIG. 11) and calculates the overcharge electric quantity in the charge cycle immediately preceding the corresponding discharge step. Fifthly, the estimation unit (microcomputer 4) sets different coefficients x for the discharged capacity obtained for each discharge cycle correspondingly to the aforementioned overcharge electric quantity. Here, the estimation unit (microcomputer 4) has a function of increasing the value of coefficient x as the overcharge electric quantity increases. Sixthly, the estimation unit (microcomputer 4) multiplies the discharged capacity obtained for each discharge cycle by the coefficient x and accumulates the value obtained, thereby calculating the integral discharged capacity B as shown in Equation 1 below. Seventhly, the estimation unit (microcomputer 4) finds a difference between the integral discharge threshold A and B (differential electric quantity A−B).

$$B=x_1B_1+x_2B_2+\ldots+x_nB_n \qquad (1)$$

Here, 1, 2, . . . n are numbers assigned to each discharge cycle of the lead storage battery, $B_1$ to $B_n$ are discharged capacities during each discharge cycle, $x_i$ to $x_n$ are coefficients for multiplying the discharged capacity in each discharge cycle.

Eighthly, the estimation unit (microcomputer 4) finds a ratio {(A−B)/A} of the differential electric quantity A−B to the integral discharge threshold A. Ninthly, the estimation unit (microcomputer 4) estimates the estimated remaining service life of the lead storage battery from the found ratio {(A−B)/A}.

In addition to the above-described configuration, one of the preferred modes also includes displaying the estimation results obtained with the estimation unit on a display unit (for example, a display, electric lamps, and the like). Further, it is preferred that the estimation results of the estimation unit (microcomputer 4) be conveyed in the form of data such as wireless data, audio data, or electronic data. Here, the effects of the twenty first and twenty second embodiments are similar to those of the ninth and tenth embodiments, respectively.

A specific feature of the twenty third embodiment is that in the configuration of the fourteenth embodiment, the estimation unit is provided with a function of calculating a difference $C_c-C_{80}$ and setting the coefficient correspondingly to the difference, where a input capacity in a charge cycle immediately following the corresponding discharge cycle is taken as $C_c$ and a 80% value of a 3 hour rate rated capacity is taken as $C_{80}$. A specific feature of the twenty fourth embodiment is that in the configuration of the twenty third embodiment, the estimation unit is provided with a function of setting a coefficient is set larger as a difference $C_c-C_{80}$ increases.

The twenty third and twenty fourth embodiments can be also explained with reference to FIG. 17. More specifically, the configuration of these embodiments is obtained by omitting a function of storing the overcharge region (region A represented by hatching in FIG. 11) in the above-described configuration of the twenty first and twenty second embodiments. A specific example of such a configuration will be described below.

Firstly, the estimation unit (microcomputer 4) stores the integral discharge threshold A serving to demand that the use of the lead storage battery 1 be stopped. Secondly, the estimation unit (microcomputer 4) determines the SOC of the lead storage battery 1 and adds up the input capacity calculated as a product of the measured value of the current measurement unit 6 and the charging time measured by the timer 47, thereby calculating the SOC value after the lead storage battery 1 has been charged. Thirdly, the estimation unit (microcomputer 4) calculates a difference $C_c-C_{80}$, where a input capacity obtained from the SOC value after the aforementioned charge is taken as $C_c$ and a 80% value of a 3 hour rate rated capacity is taken as $C_{80}$. Fourthly, the estimation unit (microcomputer 4) sets different coefficients x for the discharged capacity obtained for each discharge cycle correspondingly to the difference $C_c-C_{80}$. Here, the estimation unit (microcomputer 4) has a function of increasing the value of coefficient x as the difference $C_c-C_{80}$ increases. Fifthly, the estimation unit (microcomputer 4) multiplies the discharged capacity obtained for each discharge cycle by the coefficient x and accumulates the value obtained, thereby calculating the integral discharged capacity B as shown in Equation 1 below. Sixthly, the estimation unit (microcomputer 4) finds a difference between the integral discharge threshold A and B (differential electric quantity A−B).

$$B=x_1B_1+x_2B_2+\ldots+x_nB_n \qquad (1)$$

Here, 1, 2, . . . n are numbers assigned to each discharge cycle of the lead storage battery, $B_1$ to $B_n$ are discharged capacities during each discharge cycle, $x_1$ to $x_n$ are coefficients for multiplying the discharged capacity in each discharge cycle.

Seventhly, the estimation unit (microcomputer 4) finds a ratio {(A−B)/A} the differential electric quantity A−B to the integral discharge threshold A. Eighthly, the estimation unit (microcomputer 4) estimates the estimated remaining service life of the lead storage battery from the found ratio {(A−B)/A}.

In addition to the above-described configuration, one of the preferred modes also includes displaying the estimation results obtained with the estimation unit (microcomputer 4) on a display unit (for example, a display, electric lamps, and the like). Further, it is preferred that the estimation results of the estimation unit (microcomputer 4) be conveyed in the form of data such as wireless data, audio data, or electronic data. Here, the effects of the twenty third and twenty fourth embodiments are similar to those of the eleventh and twelfth embodiments, respectively.

The cases in which the fifteenth and sixteenth, seventeenth and eighteenth, nineteenth and twentieth, twenty first and twenty second, and twenty third and twenty fourth embodiments are used individually are described above, but it goes without saying that the estimation accuracy of the remaining service life of lead storage battery can be increased by using a combination of these embodiments. The calculation processing of the integral discharged capacity B when the fifteenth to twenty fourth embodiments are combined is similar to the processing represented by the flowcharts in FIGS. 14A and 14B.

Figure 18:
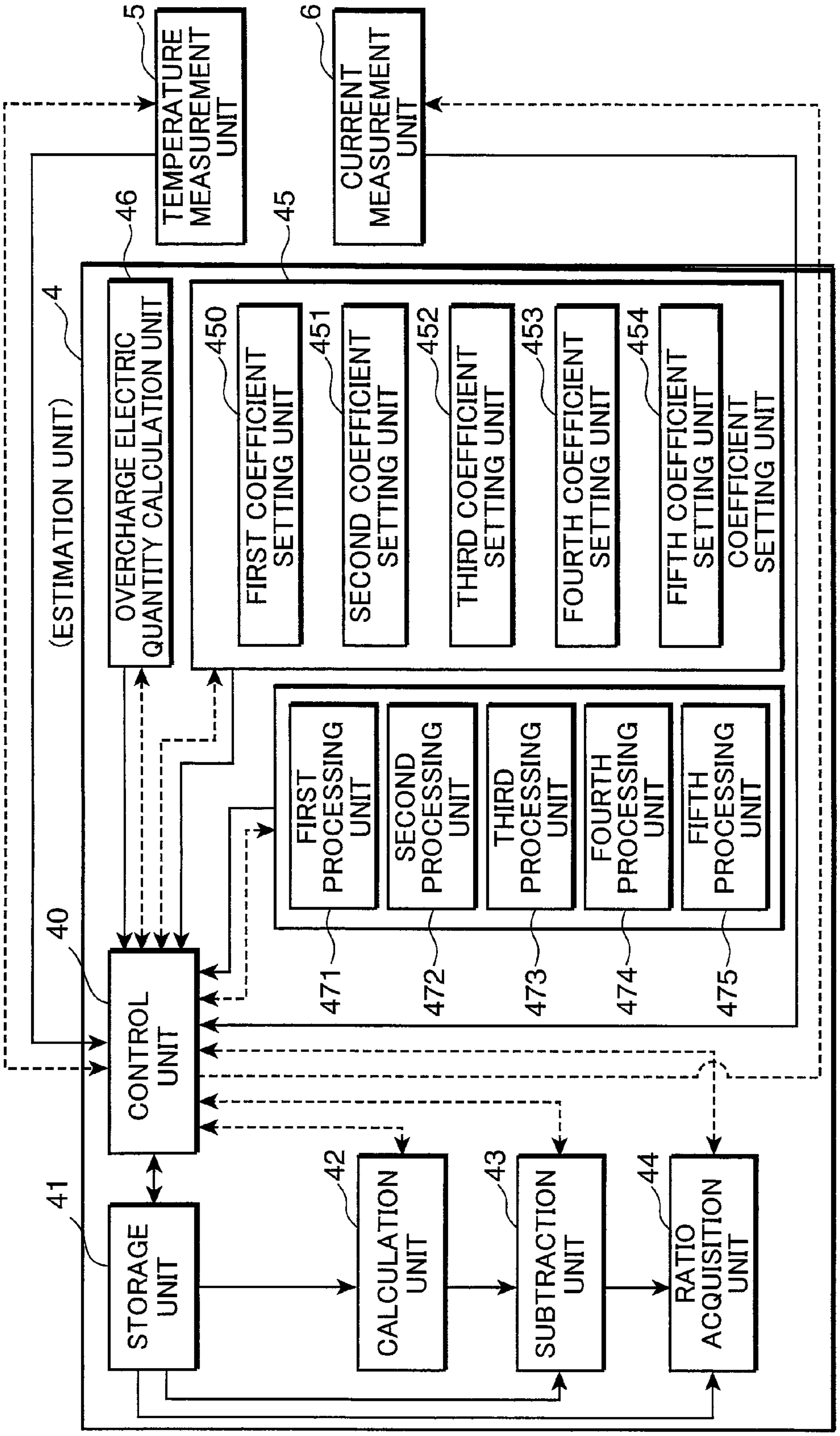
FIG. 18 is a block diagram illustrating an example of functional module of an estimation unit.

A functional module of the estimation unit 4 that is a core of the first to twenty fourth embodiments will be described below. As shown in FIG. 18 the estimation unit 4 includes a control unit 40, a storage unit 41, a calculation unit 42, a subtraction unit 43, a ratio acquisition unit 44, a coefficient setting unit 45, and an overcharge electric quantity calculation unit 46. Further, as described hereinabove, the temperature measurement unit 5 or current measurement unit 6 is connected to the estimation unit 4. A solid line arrow in FIG. 18 shows a flow of data. A dot-like arrow shows a flow of signals.

In the estimation unit 4 shown in FIG. 18, the control unit 40 controls integrally the estimation unit 4. The storage unit 41 stores a control program for operating the estimation unit 4. Further, the storage unit 41 also stores data necessary to estimate the remaining service life of the lead storage battery 1. Examples of the data necessary to estimate the remaining service life of the lead storage battery 1 include the integral discharge threshold A, integral discharged capacity B, various data for finding the integral discharged capacity B, coefficient x, a value obtained by multiplying the discharged capacity by the coefficient x, and various data for setting the coefficient x.

The subtraction unit 43 finds a value (differential electric quantity A−B) obtained by subtracting the integral discharged capacity B from the integral discharge threshold A. The ratio acquisition unit 44 finds a ratio {(A−B)/A} of the differential electric quantity A−B to the integral discharge threshold A. The coefficient setting unit 45 sets a coefficient x.

The coefficient setting unit 45 includes the above-described first to fifth coefficient setting units 450 to 454. The first to fifth coefficient setting units 450 to 454 set the coefficient x by using various data serving to set the coefficient x. The overcharge electric quantity calculation unit 46 calculates by the above-described method the overcharge electric quantity in a charge cycle immediately following the discharge cycle in which the lead storage battery has been discharged.

The estimation unit 4 is also provided with a first processing unit 471 to a fifth processing unit 475. The first processing unit 471 takes the coefficient x as 1 and finds a value obtained by multiplying the discharged capacity by the coefficient when the coefficient has not been found in the implementation of the calculation step. The second processing unit 472 sequentially accumulates the value obtained by multiplying the discharged capacity by the coefficient x took as 1, and stores in the storage unit 41 the obtained integral value as an coefficient error integral discharged capacity Berror.

The third processing unit 473 accumulates the value obtained by multiplying the discharged capacity by the coefficient x took as 1, and stores the obtained value as the integral discharged capacity B in the storage unit 41. The fourth processing unit 474 finds a ratio of the integral discharged capacity B to the coefficient error integral discharged capacity Berror. The fifth processing unit 475 displays the found ratio (Berror/B) at the display unit 7 (see FIGS. 16 and 17).

The above-described specific embodiments mainly include the inventions having the following features.

The service life estimation method for a lead storage battery according to one aspect of the invention includes the following steps implemented by an estimation unit that estimates an estimated remaining service life of the lead storage battery, a storage step of storing an integral discharge threshold A that is a reference for determination of a service life of the lead storage battery under a standard condition with predetermined values of a surface temperature, a charge current, and a discharge current of the lead storage battery; a calculation step of calculating an integral discharged capacity B by replacing the accumulated value of discharged capacity when the lead storage battery deteriorates to a level under the actual conditions including the actually measured values of the surface temperature, the charge current, and the discharge current of the lead storage battery with an accumulated value of discharged capacity when the lead storage battery would deteriorate under said standard condition to substantially the same level as said deterioration level under the actual condition, and a subtraction step of obtaining a differential electric quantity A−B by subtracting the integral discharged capacity B from the integral discharge threshold A; and an estimation step of estimating the estimated remaining service life of the lead storage battery by using the differential electric quantity.

In the lead storage battery, lead dioxide ($PbO_2$) is used as a positive electrode active material. The inventors have discovered that the variation of utilization ratio (ratio of actual use in a battery reaction) of the lead dioxide correlates stronger with the accumulated discharged capacity than with the number of charge-discharge cycles. Because the lead dioxide is micronized by repeated volume changes, namely, contraction (charge) and expansion (discharge), electrochemical reactivity in the lead dioxide changes. Therefore, according to the discovery made by the inventors, the advancement of lead dioxide micronize can be supposed to correlate stronger with the accumulated value (that is, the accumulated discharged capacity) of volume changes of lead dioxide (volume changes caused by expansion of lead dioxide) than with a simple number of charge and discharge cycles. Therefore, with such a configuration, the remaining service life of the lead storage battery can be estimated from the value obtained by subtracting the integral discharged capacity B (accumulated value of volume changes in the lead dioxide) that is calculated by replacing the accumulated value of discharged capacity when the lead storage battery deteriorates to a level under the actual conditions including the actually measured values of the surface temperature, the charge current, and the discharge current of the lead storage battery with an accumulated value of discharged capacity when the lead storage battery would deteriorate under said standard condition to substantially the same level as said deterioration level under the actual condition, from the integral discharge threshold A serving to demand that the use of the lead storage battery be stopped.

Therefore, by determining a difference between the integral discharge threshold A that demands that the use of the lead storage battery be stopped and the integral discharged capacity B that represents the accumulated value of volume changes in the lead dioxide, it is possible to determine the degree to which the accumulated value of the volume changes in the lead dioxide came close to the integral discharge threshold A that demands that the use of the lead storage battery be stopped. As a result, the estimation accuracy of the remaining service life of the lead storage battery is increased and therefore the remaining service life of the lead storage battery can be estimated with good accuracy. Therefore, for example, the usage limit of the lead storage battery can be accurately evaluated and the rational replacement period of the lead storage battery can be accurately estimated in a case where the lead storage battery is used in a cyclic mode such as that of a power source for a transport vehicle. Further, a distance that can be traveled by the transport vehicle can be easily estimated.

In accordance with the present invention, the integral discharged capacity is taken as an accumulated value of volume changes of the lead dioxide, but even when the integral input capacity is used, the effect obtained will be similar to that obtained with the integral discharged capacity because the integral input capacity is an accumulated value of volume changes (contraction) of the lead dioxide. However, taking into account that part of the input charge is used for a side reaction that is accompanied by overcharge (that is, cannot be considered as an accumulated value of volume changes of lead dioxide), it is preferred that the integral discharged capacity be used.

In the above-described configuration, it is preferred that the estimation step include a ratio acquisition step of finding a ratio {(A−B)/A} of the differential electric quantity A−B to the integral discharge threshold A, and the estimation unit estimate the estimated remaining service life of the lead storage battery from the ratio {(A−B)/A} found in the ratio acquisition step.

With such a configuration, because the integral discharged capacity B does not come close to the integral discharge threshold A as the ratio {(A−B)/A} comes close to 1, the estimated remaining service life of the lead storage battery is estimated to be long. By contrast, because the integral discharged capacity B comes close to the integral discharge threshold A as the ratio {(A−B)/A} comes close to 0, the estimated remaining service life of the lead storage battery is estimated to be short. Thus, the remaining service life of the lead storage battery is easily determined.

In the above-described configuration, it is preferred that the calculation step be a step of finding a multiplied value obtained by multiplying the discharged capacity that represents a electric quantity discharged from the lead storage battery by a coefficient found by reflecting the actual conditions for each cycle in which the lead storage battery is discharged, and calculating the integral discharged capacity B as shown by Equation (1) below by sequentially accumulating the multiplied value for each cycle.

$$B=x_1B+x_2B_2+\ldots+x_nB_n \qquad (1)$$

Here, 1, 2, . . . n are numbers assigned to each discharge cycle of the lead storage battery, $B_1$ to $B_n$ are discharged capacities during each discharge cycle, $x_1$ to $x_n$ are coefficients for multiplying the discharged capacity in each discharge cycle.

With such a configuration, other factors (for example, the development of lead lattice (collector) corrosion caused by charging at a high temperature or overcharging) that affect the electrochemical reactivity are reflected in the calculation of the integral discharged capacity B. Therefore, the estimation of remaining service life adapted to actual usage conditions of the lead storage battery can be conducted and the estimation accuracy of the remaining service life of the lead storage battery is increased.

From the standpoint of taking into account the factors affecting each discharge (for example, due to a difference in the discharge current, the discharged capacity that is taken out differs even between the as-produced lead storage batteries that have not yet deteriorated), the same effect can be also obtained by multiplying the integral discharge threshold A that demands that the use of the lead storage battery be stopped by the coefficient. When the specifications and charge-discharge conditions of lead storage batteries are the same, it is preferred that the integral discharge threshold A be multiplied by the coefficient.

However, because the lead storage battery is by itself a resistor, when the discharge current is large, heat generation in the battery caused by Joule heat becomes larger. Therefore, when no sufficient cooling is conducted before the next charge, the surface temperature of the lead storage battery remains high when the next charge is started. Where the lead storage battery is charged when the surface temperature thereof is still high, the remaining service life of the lead storage battery is shortened, as described hereinabove. Therefore, by multiplying the discharged capacity obtained from the discharge current by the coefficient, it is possible to reflect the discharge current value that affects the lead storage battery life in the estimation of the remaining service life. Therefore, life estimation accuracy is increased.

In such a configuration, it is preferred that the calculation step further include a step of finding the multiplied value obtained by multiplying the discharged capacity by the coefficient when the coefficient has been found, and finding the multiplied value obtained by multiplying the discharged capacity by 1 as the coefficient when the coefficient has not been found; a step of finding a coefficient error integral discharged capacity Berror obtained by sequentially accumulating of only the discharged capacity when the coefficient has not been found, and a step of finding a ratio of the coefficient error integral discharged capacity Berror to the integral discharged capacity B.

Therefore, the user can judge the share of the coefficient error integral discharged capacity Berrorin the integral discharged capacity B and recognize the accuracy of remaining service life estimation.

For example, where the share of the coefficient error integral discharged capacity Berror has occurred in the integral discharged capacity B is close to "1", it is clear that the coefficient determined by the factors affecting the service life of the lead storage battery has not been taken into account in the estimation of the remaining service life. Therefore, the estimation accuracy of the remaining service life is determined to be low. By contrast, where the share of the coefficient error integral discharged capacity Berror in the integral discharged capacity B is close to "0", the coefficient is determined to have been taken into account in evaluating the remaining service life. Therefore the estimation accuracy of the remaining service life is determined to be high.

In the above-described configuration, it is desirable that the coefficient be set correspondingly to a temperature of the lead storage battery when the lead storage battery is discharged.

Whether the lead storage battery deteriorates rapidly or slowly is affected by the temperature of the lead storage battery. For this reason, with such a configuration, the coefficient is set correspondingly to a temperature of the lead storage battery when the lead storage battery is discharged. Therefore, the estimation accuracy of the remaining service life of the lead storage battery is increased.

In such a configuration, it is desirable that a larger coefficient be set for a higher temperature of the lead storage battery.

With such a configuration, a large coefficient is set for a high temperature at which deterioration of the lead storage battery can easily advance. Therefore, the estimation accuracy of the remaining service life of the lead storage battery is further increased.

In such a configuration, it is desirable that the coefficient be set correspondingly to a charge current in a charge cycle immediately following a discharge cycle of the lead storage battery.

Whether the lead storage battery deteriorates rapidly or slowly is affected by a charge current in a charge cycle immediately following a discharge cycle of the lead storage battery. For this reason, with such a configuration, the coefficient is set correspondingly to a charge current in a charge cycle immediately following the discharge cycle of the lead storage battery. Therefore, the estimation accuracy of the remaining service life of the lead storage battery is increased.

In such a configuration, it is desirable that a larger coefficient be set for a higher charge current.

With such a configuration, a large coefficient is set under conditions at which deterioration of the lead storage battery can easily advance, as in a case of a high charge current. Therefore, the estimation accuracy of the remaining service life of the lead storage battery is further increased.

In such a configuration, it is desirable that the coefficient be set correspondingly to a discharge current when the lead storage battery is discharged.

Whether the lead storage battery deteriorates rapidly or slowly is affected by a discharge current when the lead storage battery is discharged. For this reason, with such a configuration, the coefficient is set correspondingly to a discharge current when the lead storage battery is discharged. Therefore, the estimation accuracy of the remaining service life of the lead storage battery is increased.

In such a configuration, it is desirable that a larger coefficient be set for a higher discharge current.

With such a configuration, a large coefficient is set under conditions at which deterioration of the lead storage battery can easily advance, as in a case of a high discharge current. Therefore, the estimation accuracy of the remaining service life of the lead storage battery is further increased.

In the above-described configuration it is desirable that the coefficient be set correspondingly to an overcharge electric quantity in a charge cycle immediately following a discharge cycle of the lead storage battery, and the overcharge electric quantity is a difference between a input capacity and a discharged capacity in a discharge cycle immediately after charging at the input capacity.

Whether the lead storage battery deteriorates rapidly or slowly is affected by an overcharge electric quantity in a charge cycle immediately following a discharge cycle. For this reason, with such a configuration, the coefficient is set correspondingly to an overcharge electric quantity in a charge cycle immediately following a discharge cycle. Therefore, the estimation accuracy of the remaining service life of the lead storage battery is increased.

In the above-described configuration, it is desirable that a larger coefficient be set for a higher overcharge electric quantity.

With such a configuration, a large coefficient is set under conditions at which deterioration of the lead storage battery can easily advance, as in a case of a large overcharge electric quantity. Therefore, the estimation accuracy of the remaining service life of the lead storage battery is further increased.

In the above-described configuration, it is desirable that when a input capacity in a charge cycle immediately following a discharge cycle of the lead storage battery is taken as $C_c$ and a 80% value of a discharged capacity, generated during the voltage of the lead storage battery reaches the preset discharge end voltage when the lead storage battery is discharged under the conditions of a surface temperature of the lead storage battery of 25 degrees and a discharge current of 3 hour rate, is taken as $C_{80}$, the coefficient is set correspondingly to a difference $C_c-C_{80}$.

Whether the lead storage battery deteriorates rapidly or slowly is affected by a difference $C_c-C_{80}$. For this reason, with such a configuration, the coefficient is set correspondingly to the difference $C_c-C_{80}$. Therefore, the estimation accuracy of the remaining service life of the lead storage battery is increased.

In the above-described configuration, it is desirable that a larger coefficient be set for a larger value of the difference $C_c-C_{80}$.

With such a configuration, a large coefficient is set under conditions at which deterioration of the lead storage battery can easily advance, as in a case of a large value of the difference $C_c-C_{80}$. Therefore, the estimation accuracy of the remaining service life of the lead storage battery is further increased.

A power source system according to another aspect of the present invention includes a lead storage battery as a power source; a charging device serving to charge the lead storage battery, and an estimation unit that estimates a remaining service life of the lead storage battery, wherein the estimation unit stores an integral discharge threshold A that is a reference for determination of a service life of the lead storage battery under a standard condition with predetermined values of a surface temperature, a charge current, and a discharge current of the lead storage battery, said estimation unit obtains an accumulated value of integral discharged capacity B by replacing the accumulated value of discharged capacity when the lead storage battery deteriorates to a level under the actual conditions including the actually measured values of the surface temperature, the charge current, and the discharge current of the lead storage battery with an accumulated value of discharged capacity when the lead storage battery would deteriorate under said standard condition to substantially the same level as said deterioration level under the actual condition, and said estimation unit estimates a remaining service life of the lead storage battery with the use of difference between the integral discharge threshold A and the integral discharged capacity B.

With such a configuration, the remaining service life of the lead storage battery is estimated from a value obtained by subtracting the integral discharged capacity B (accumulated value of volume changes in the lead dioxide) that is calculated by replacing the accumulated value of discharged capacity when the lead storage battery deteriorates to a level under the actual conditions including the actually measured values of the surface temperature, the charge current, and the discharge current of the lead storage battery with an accumulated value of discharged capacity when the lead storage battery would deteriorate under said standard condition to substantially the same level as said deterioration level under the actual condition, from the integral discharge threshold A serving to demand that the use of the lead storage battery be stopped.

Therefore, by determining a difference between the integral discharge threshold A that demands that the use of the lead storage battery be stopped and the integral discharged capacity B that represents the accumulated value of volume changes in the lead dioxide, it is possible to determine the degree to which the accumulated value of the volume changes in the lead dioxide came close to the integral discharge threshold A that demands that the use of the lead storage battery be stopped. As a result, the estimation accuracy of the remaining service life of the lead storage battery is increased and therefore the remaining service life of the lead storage battery can be estimated with good accuracy. Therefore, for example, the usage limit of the lead storage battery can be accurately evaluated and the rational replacement period of the lead storage battery can be accurately estimated in a case where the lead storage battery is used in a cyclic mode such as that of a power source for a transport vehicle. Further, a distance that can be traveled by the transport vehicle can be easily estimated.

In the above-described configuration, it is desirable that the estimation unit include a storage unit that stores the integral discharge threshold A; a calculation unit that calculates the integral discharged capacity B; a subtraction unit that subtracts the integral discharged capacity B calculated by the calculation unit from the integral discharge threshold A stored in the storage unit and finds a differential electric quantity A−B, and a ratio acquisition unit that finds a ratio $\{(A-B)/A\}$ of the differential electric quantity A−B obtained by the subtraction unit to the integral discharge threshold A, wherein an estimated remaining service life of the lead storage battery is estimated from the ratio $\{(A-B)/A\}$.

With such a configuration, because the integral discharged capacity B does not come close to the integral discharge threshold A as the ratio $\{(A-B)/A\}$ comes close to 1, a long estimated remaining service life of the lead storage battery can be estimated. By contrast, because the integral discharged capacity B comes close to the integral discharge threshold A as the ratio $\{(A-B)/A\}$ comes close to 0, the estimation unit 4 can estimate a short estimated service life of the lead storage battery. Therefore, the remaining service life of the lead storage battery is easily determined.

In the above-described configuration, it is desirable that the calculation unit finds a multiplied value obtained by multiplying the discharged capacity that represents a capacity discharged from the lead storage battery by a coefficient found by reflecting the actual conditions for each cycle in which the lead storage battery is discharged, and calculates the integral discharged capacity B as shown by Equation (1) below by sequentially accumulating the multiplied value for each cycle.

$$B=x_1B_1x_2B_2+\ldots+x_nB_n \qquad (1)$$

Here, 1, 2, . . . n are numbers assigned to each discharge cycle of the lead storage battery, $B_1$ to $B_n$ are discharged capacities during each discharge cycle, $x_1$ to $x_n$ are coefficients for multiplying the discharged capacity in each discharge cycle.

With such a configuration, other factors (for example, the development of lead lattice (collector) corrosion caused by charging at a high temperature or overcharging) that affect the electrochemical reactivity are reflected in the calculation of the integral discharged capacity B. Therefore, the estimation of remaining service life adapted to actual usage conditions of the lead storage battery can be conducted and the estimation accuracy of the remaining service life of the lead storage battery is increased.

In the above-described configuration, it is desirable that the estimation unit finds the multiplied value obtained by multiplying the discharged capacity by the coefficient when the coefficient has been found, and finding the multiplied value obtained by multiplying the discharged capacity by 1 as the coefficient when the coefficient has not been found, the estimation unit finds a coefficient error integral discharged capacity Berror obtained by sequentially accumulating of only the discharged capacity when the coefficient has not been found, and the estimation unit finds a ratio of the coefficient error integral discharged capacity Berror to the integral discharged capacity B.

Therefore, the user can judge the share of the coefficient error integral discharged capacity Berror has occurred in the integral discharged capacity B and recognize the accuracy of remaining service life estimation.

For example, where the share of the coefficient error integral discharged capacity Berror in the integral discharged capacity B is close to "1", it is clear that the coefficient determined by the factors affecting the service life of the lead storage battery has not been taken into account in the estimation of the remaining service life. Therefore, the estimation accuracy of the remaining service life is determined to be low. By contrast, where the share of the coefficient error integral discharged capacity Berror in the integral discharged capacity B is close to "0", the coefficient is determined to have been taken into account in evaluating the remaining service life. Therefore the estimation accuracy of the remaining service life is determined to be high.

In the above-described configuration, it is desirable that a temperature measurement unit that measures a temperature of the lead storage battery be further provided and that the estimation unit further include a first coefficient setting unit that sets the coefficient correspondingly to a measured value of the temperature measurement unit.

Whether the lead storage battery deteriorates rapidly or slowly is affected by the temperature of the lead storage battery when the lead storage battery is discharged. For this reason, with such a configuration, the coefficient is set correspondingly to a temperature of the lead storage battery when the lead storage battery is discharged. Therefore, the estimation accuracy of the remaining service life of the lead storage battery is increased.

In such a configuration, it is desirable that the first coefficient setting unit set a larger coefficient for a larger measured value of the temperature measurement unit.

With such a configuration, a large coefficient is set for a high temperature at which deterioration of the lead storage battery can easily advance. Therefore, the estimation accuracy of the remaining service life of the lead storage battery is further increased.

It is desirable that above-described configuration further include a current measurement unit that measures a value of a charge current in a charge cycle immediately following a discharge cycle of the lead storage battery, and that the estimation unit further include a second coefficient setting unit that sets the coefficient correspondingly to a measured value of the current measurement unit.

Whether the lead storage battery deteriorates rapidly or slowly is affected by a charge current in a charge cycle immediately following a discharge cycle. For this reason, with such a configuration, the coefficient is set correspondingly to a charge current in a charge cycle immediately following the discharge cycle. Therefore, the estimation accuracy of the remaining service life of the lead storage battery is increased.

In such a configuration, it is desirable that the second coefficient setting unit set a larger coefficient for a larger measured value of the current measurement unit.

With such a configuration, a large coefficient is set under conditions at which deterioration of the lead storage battery can easily advance, as in a case of a high charge current. Therefore, the estimation accuracy of the remaining service life of the lead storage battery is further increased.

It is desirable that above-described configuration further include a current measurement unit that measures a magnitude of a discharge current when the lead storage battery is discharged, and that the estimation unit further include a third coefficient setting unit that sets the coefficient correspondingly to a measured value of the current measurement unit.

Whether the lead storage battery deteriorates rapidly or slowly is affected by a discharge current when the lead storage battery is discharged. For this reason, with such a configuration, the coefficient is set correspondingly to a discharge current when the lead storage battery is discharged. Therefore, the estimation accuracy of the remaining service life of the lead storage battery is increased.

In the above-described configuration, it is desirable that the third coefficient setting unit sets a larger coefficient for a larger measured value of the current measurement unit.

With such a configuration, a large coefficient is set under conditions at which deterioration of the lead storage battery can easily advance, as in a case of a high discharge current. Therefore, the estimation accuracy of the remaining service life of the lead storage battery is further increased.

In the above-described configuration, it is desirable that the estimation unit further include an overcharge electric quantity calculation unit that calculates an overcharge electric quantity in a charge cycle immediately following a discharge cycle of the lead storage battery, and a fourth coefficient setting unit that sets the coefficient correspondingly to the calculated overcharge electric quantity, wherein the overcharge electric quantity is a difference between a input capacity and a discharged capacity in a discharge cycle immediately after charging at the input capacity.

Whether the lead storage battery deteriorates rapidly or slowly is affected by an overcharge electric quantity in a charge cycle immediately following a discharge cycle. For this reason, with such a configuration, the coefficient is set correspondingly to an overcharge electric quantity in a charge cycle immediately following a discharge cycle. Therefore, the estimation accuracy of the remaining service life of the lead storage battery is increased.

In the above-described configuration, it is desirable that the fourth coefficient setting unit set a larger coefficient for a higher overcharge electric quantity.

With such a configuration, a large coefficient is set under conditions at which deterioration of the lead storage battery can easily advance, as in a case of a high overcharge electric quantity. Therefore, the estimation accuracy of the remaining service life of the lead storage battery is further increased.

In the above-described configuration, it is desirable that the estimation unit further include a fifth coefficient setting unit that, when a input capacity in a charge cycle immediately following a discharge cycle of the lead storage battery is taken as $C_c$ and a 80% value of a discharged capacity, generated during the voltage of the lead storage battery reaches the preset discharge end voltage when the lead storage battery is discharged under the conditions of a surface temperature of the lead storage battery of 25 degrees and a discharge current of 3 hour rate, is taken as $C_{go}$, sets the coefficient correspondingly to a difference $C_c$–$C_{80}$.

Whether the lead storage battery deteriorates rapidly or slowly is affected by a difference $C_c$–$C_{80}$. For this reason, with such a configuration, the coefficient is set correspondingly to the difference $C_c$–$C_{80}$. Therefore, the estimation accuracy of the remaining service life of the lead storage battery is increased.

In the above-described configuration, it is desirable that the fifth coefficient setting unit set a larger coefficient for a larger difference $C_c$–$C_{80}$.

With such a configuration, a large coefficient is set under conditions at which deterioration of the lead storage battery can easily advance, as in a case of a large value of the difference $C_c$–$C_{80}$. Therefore, the estimation accuracy of the remaining service life of the lead storage battery is further increased.

Industrial Applicability

The service life estimation method for a lead storage battery and a power source system in accordance with the present invention can accurately evaluate a usage limit of a highly safe lead storage battery suitable for tough use and improve the evaluation accuracy of a rational replacement period of the lead storage battery. Therefore, these method and system can make a significant contribution to the development of industry.

The invention claimed is:

1. A service life estimation method for a lead storage battery, the method to be implemented by an estimation unit that estimates an estimated remaining service life of the lead storage battery, comprising:

a storage step of storing an integral discharge threshold A that is a reference for determination of a service life of the lead storage battery under a standard condition with predetermined values of a surface temperature, a charge current, and a discharge current of the lead storage battery;

a calculation step of calculating an integral discharged capacity B by replacing the accumulated value of discharged capacity when the lead storage battery deteriorates to a level under actual conditions including actually measured values of the surface temperature, the charge current, and the discharge current of the lead storage battery with an accumulated value of discharged capacity when the lead storage battery would deteriorate under said standard condition to substantially the same level as said deterioration level under the actual condition, and a subtraction step of obtaining a differential electric quantity A–B by subtracting the integral discharged capacity B from the integral discharge threshold A; and an estimation step of estimating the estimated remaining service life of the lead storage battery by using the differential electric quantity.

2. The service life estimation method for a lead storage battery according to claim 1, wherein the estimation step includes a ratio acquisition step of finding a ratio {(A–B)/A} of the differential electric quantity A–B to the integral discharge threshold A, and wherein the estimation unit estimates the estimated remaining service life of the lead storage battery from the ratio {(A–B)/A} found in the ratio acquisition step.

3. The service life estimation method for a lead storage battery according to claim 1, wherein the calculation step is a step of finding a multiplied value obtained by multiplying the discharged capacity that represents a electric quantity discharged from the lead storage battery by a coefficient found by reflecting the actual conditions for each cycle in which the lead storage battery is discharged, and calculating the integral discharged capacity B as shown by Equation (1) below by sequentially accumulating the multiplied value for each cycle:

$$B=x_1B_1+x_2B_2+\ldots+x_nB_n \quad (1)$$

where, 1, 2, . . . n are numbers assigned to each discharge cycle of the lead storage battery, $B_1$-$B_n$ are discharged capacities during each discharge cycle, $x_1$-$x_n$ are coefficients for multiplying the discharged capacity in each discharge cycle.

4. The service life estimation method for a lead storage battery according to claim 3, wherein the calculation step further comprises:

a step of finding the multiplied value obtained by multiplying the discharged capacity by the coefficient when the coefficient has been found, and finding the multiplied value obtained by multiplying the discharged capacity by 1 as the coefficient when the coefficient has not been found;

a step of finding a coefficient error integral discharged capacity Berror obtained by sequentially accumulating of only the discharged capacity when the coefficient has not been found, and a step of finding a ratio of the coefficient error integral discharged capacity Berror to the integral discharged capacity B.

5. The service life estimation method for a lead storage battery according to claim 3, wherein the coefficient is set correspondingly to a temperature of the lead storage battery when the lead storage battery is discharged.

6. The service life estimation method for a lead storage battery according to claim 5, wherein the coefficient is set larger as a temperature of the lead storage battery increases.

7. The service life estimation method for a lead storage battery according to claim 3, wherein the coefficient is set correspondingly to a charge current in a charge cycle immediately following the discharge cycle of the lead storage battery.

8. The service life estimation method for a lead storage battery according to claim 7, wherein a coefficient is set larger as the charge current becomes larger.

9. The service life estimation method for a lead storage battery according to claim 3, wherein the coefficient is set correspondingly to a discharge current when the lead storage battery is discharged.

10. The service life estimation method for a lead storage battery according to claim 9, wherein the coefficient is set larger as the discharge current becomes larger.

11. The service life estimation method for a lead storage battery according to claim 3, wherein the coefficient is set correspondingly to an overcharge electric quantity in a charge cycle immediately following a discharge cycle of the lead storage battery, and the overcharge electric quantity is a difference between a input capacity and a discharged capacity in a discharge cycle immediately after charging at the input capacity.

12. The service life estimation method for a lead storage battery according to claim 11, wherein the coefficient is set larger as the overcharge electric quantity increases.

13. The service life estimation method for a lead storage battery according to claim 3, wherein when a input capacity in a charge cycle immediately following a discharge cycle of the lead storage battery is taken as $C_c$ and a 80% value of a discharged capacity, generated during the voltage of the lead storage battery reaches the preset discharge end voltage when the lead storage battery is discharged under conditions of a surface temperature of the lead storage battery of 25 degrees and a discharge current of 3 hour rate, is taken as $C_{80}$, the coefficient is set correspondingly to a difference $C_c-C_{80}$.

14. The service life estimation method for a lead storage battery according to claim 13, wherein the coefficient is set larger as the value of the difference $C_c-C_{80}$ increases.

15. A power source system, comprising:

a lead storage battery as a power source;

a charging device that charges the lead storage battery; and an estimation unit that estimates a remaining service life of the lead storage battery, wherein the estimation unit stores an integral discharge threshold A that is a reference for determination of a service life of the lead storage battery under a standard condition with predetermined values of a surface temperature, a charge current, and a discharge current of the lead storage battery, said estimation unit obtains an accumulated value of integral discharged capacity B by replacing the accumulated value of discharged capacity when the lead storage battery deteriorates to a level under actual conditions including actually measured values of the surface temperature, the charge current, and the discharge current of the lead storage battery with an accumulated value of discharged capacity when the lead storage battery would deteriorate under said standard condition to substantially the same level as said deterioration level under the actual condition, and said estimation unit estimates a remaining service life of the lead storage battery with the use of difference between the integral discharge threshold A and the integral discharged capacity B.

16. The power source system according to claim 15, wherein the estimation unit comprises:

a storage unit that stores the integral discharge threshold A;

a calculation unit that calculates the integral discharged capacity B;

a subtraction unit that subtracts the integral discharged capacity B calculated by the calculation unit from the integral discharge threshold A stored in the storage unit and finds a differential electric quantity A−B; and a ratio acquisition unit that finds a ratio {(A−B)/A} of the differential electric quantity A−B obtained by the subtraction unit to the integral discharge threshold A, wherein an estimated remaining service life of the lead storage battery is estimated from the ratio {(A−B)/A}.

17. The power source system according to claim 15, wherein the calculation unit finds a multiplied value obtained by multiplying the discharged capacity that represents a capacity discharged from the lead storage battery by a coefficient found by reflecting the actual conditions for each cycle in which the lead storage battery is discharged, and calculates the integral discharged capacity B as shown by Equation (1) below by sequentially accumulating the multiplied value for each cycle:

$$B=x_1B_1+x_2B_2+\ldots+x_nB_n \qquad (1)$$

where, 1, 2, . . . n are numbers assigned to each discharge cycle of the lead storage battery, $B_1$-$B_n$ are discharged capacities during each discharge cycle, $x_1$-$x_n$ are coefficients for multiplying the discharged capacity in each discharge cycle.

18. The power source system according to claim 17, wherein the estimation unit finds the multiplied value obtained by multiplying the discharged capacity by the coefficient when the coefficient has been found, and finding the multiplied value obtained by multiplying the discharged capacity by 1 as the coefficient when the coefficient has not been found, the estimation unit finds a coefficient error integral discharged capacity Berror obtained by sequentially accumulating of only the discharged capacity when the coefficient has not been found, and the estimation unit finds a ratio of the coefficient error integral discharged capacity Berror to the integral discharged capacity B.

19. The power source system according to claim 17, further comprising a temperature measurement unit that measures a temperature of the lead storage battery, wherein the estimation unit further includes a first coefficient setting unit that sets the coefficient correspondingly to a measured value of the temperature measurement unit.

20. The power source system according to claim 19, wherein the first coefficient setting unit sets the coefficient larger as a measured value of the temperature measurement unit increases.

21. The power source system according to claim 17, further comprising a current measurement unit that measures a magnitude of a charge current in a charge cycle immediately following a discharge cycle of the lead storage battery, wherein the estimation unit further comprises a second coefficient setting unit that sets the coefficient correspondingly to a measured value of the current measurement unit.

22. The power source system according to claim 21, wherein the second coefficient setting unit sets the coefficient larger as a measured value of the current measurement unit increases.

23. The power source system according to claim 17, further comprising a current measurement unit that measures a magnitude of a discharge current when the lead storage battery is discharged, wherein the estimation unit further comprises a third coefficient setting unit that sets the coefficient correspondingly to a measured value of the current measurement unit.

24. The power source system according to claim 23, wherein the third coefficient setting unit sets the coefficient larger as a measured value of the current measurement unit increases.

25. The power source system according to claim 17, wherein the estimation unit further comprises:

an overcharge electric quantity calculation unit that calculates an overcharge electric quantity in a charge cycle immediately following a discharge cycle of the lead storage battery; and a fourth coefficient setting unit that sets the coefficient correspondingly to the calculated overcharge electric quantity, wherein the overcharge electric quantity is a difference between a input capacity and a discharged capacity in a discharge cycle immediately after charging at the input capacity.

26. The power source system according to claim 25, wherein the fourth coefficient setting unit sets the coefficient larger as the overcharge electric quantity increases.

27. The power source system according to claim 17, wherein the estimation unit further comprises a fifth coefficient setting unit that when a input capacity in a charge cycle immediately following a discharge cycle of the lead storage battery is taken as $C_c$ and a 80% value of a discharged capacity, generated during the voltage of the lead storage battery reaches a preset discharge end voltage when the lead storage battery is discharged under conditions of a surface temperature of the lead storage battery of 25 degrees and a discharge current of 3 hour rate, is taken as $C_{80}$, sets the coefficient correspondingly to a difference $C_c - C_{80}$.

28. The power source system according to claim 27, wherein the fifth coefficient setting unit sets the coefficient larger as a difference $C_c - C_{80}$ increases.

* * * * *